United States Patent
Gupta et al.

(10) Patent No.: US 12,374,855 B2
(45) Date of Patent: Jul. 29, 2025

(54) FIBER-COUPLED LASER LIGHT SOURCE

(71) Applicant: Lightmatter, Inc., Boston, MA (US)

(72) Inventors: Shashank Gupta, Newton, MA (US);
Michael Gould, Woburn, MA (US);
James Carr, Tewksbury, MA (US);
Nicholas C. Harris, Boston, MA (US);
Sven Mahnkopf, Maple Glen, PA (US);
David Demmer, Toronto (CA)

(73) Assignee: Lightmatter, Inc., Boston, MA (US)

(\*) Notice: Subject to any disclaimer, the term of this patent is extended or adjusted under 35 U.S.C. 154(b) by 486 days.

(21) Appl. No.: 17/899,277

(22) Filed: Aug. 30, 2022

(65) Prior Publication Data

US 2023/0067275 A1    Mar. 2, 2023

Related U.S. Application Data

(60) Provisional application No. 63/239,337, filed on Aug. 31, 2021.

(51) Int. Cl.
*H01S 5/02253* (2021.01)
*G02B 6/42* (2006.01)
(Continued)

(52) U.S. Cl.
CPC ........ *H01S 5/02253* (2021.01); *G02B 6/4249* (2013.01); *H01S 5/0064* (2013.01);
(Continued)

(58) Field of Classification Search
CPC .. H01S 5/02253; H01S 5/0064; H01S 5/0071; H01S 5/02208; H01S 5/02251;
(Continued)

(56) References Cited

U.S. PATENT DOCUMENTS

| | | |
|---|---|---|
| 3,872,293 A | 3/1975 | Green |
| 4,567,569 A | 1/1986 | Caulfield et al. |
| | (Continued) | |

FOREIGN PATENT DOCUMENTS

| | | |
|---|---|---|
| CN | 101630178 A | 1/2010 |
| WO | WO 2005/029404 A2 | 3/2005 |
| | (Continued) | |

OTHER PUBLICATIONS

International Search Report and Written Opinion dated Mar. 15, 2016, in connection with International Application No. PCT/US2015/034500.

(Continued)

*Primary Examiner* — Collin X Beatty
(74) *Attorney, Agent, or Firm* — Wolf, Greenfield & Sacks, P.C.

(57) ABSTRACT

Described herein are photonic sources and related system architectures that can satisfy the optical power requirements of large photonic accelerators. Some embodiments relate to a computer comprising a photonic accelerator configured to perform matrix multiplication; a fiber array optically coupled to the photonic accelerator; and a photonic source optically coupled to the fiber array. The photonic source comprising a laser array comprising a plurality of monolithically co-integrated lasers, and a coupling lens array comprising a plurality of monolithically co-integrated lenses, the coupling lens array optically coupling the laser array to the fiber array. The laser array is configured to output between 0.1 W and 10 W of optical power.

25 Claims, 18 Drawing Sheets

(51) Int. Cl.
  *G06F 17/16* (2006.01)
  *H01S 5/00* (2006.01)
  *H01S 5/02208* (2021.01)
  *H01S 5/02251* (2021.01)
  *H01S 5/024* (2006.01)
  *H01S 5/40* (2006.01)

(52) U.S. Cl.
  CPC ........ *H01S 5/0071* (2013.01); *H01S 5/02208* (2013.01); *H01S 5/02251* (2021.01); *H01S 5/02423* (2013.01); *H01S 5/02469* (2013.01); *H01S 5/4025* (2013.01); *G06F 17/16* (2013.01)

(58) Field of Classification Search
  CPC ............. H01S 5/02423; H01S 5/02469; H01S 5/4025; H01S 5/02216; H01S 5/02345; H01S 5/02326; H01S 5/4031; H01S 5/141; H01S 5/4062; G02B 6/4249; G06F 17/16; G06E 3/008; G06N 7/01; G06N 20/10; G06N 3/067
  See application file for complete search history.

(56) References Cited

U.S. PATENT DOCUMENTS

| | | |
|---|---|---|
| 4,595,994 A | 6/1986 | Verber et al. |
| 4,607,344 A | 8/1986 | Athale et al. |
| 4,633,428 A | 12/1986 | Byron |
| 4,686,646 A | 8/1987 | Goutzoulis |
| 4,739,520 A | 4/1988 | Collins, Jr. et al. |
| 4,809,204 A | 2/1989 | Dagenais et al. |
| 4,849,940 A | 7/1989 | Marks, II et al. |
| 4,877,297 A | 10/1989 | Yeh |
| 4,948,212 A | 8/1990 | Cheng et al. |
| 5,004,309 A | 4/1991 | Caulfield et al. |
| 5,077,619 A | 12/1991 | Toms |
| 5,095,459 A | 3/1992 | Ohta et al. |
| 5,333,117 A | 7/1994 | Ha et al. |
| 5,383,042 A | 1/1995 | Robinson |
| 5,394,257 A | 2/1995 | Horan et al. |
| 5,428,711 A | 6/1995 | Akiyama et al. |
| 5,432,722 A | 7/1995 | Guilfoyle et al. |
| 5,495,356 A | 2/1996 | Sharony et al. |
| 5,576,873 A | 11/1996 | Crossland et al. |
| 5,640,261 A | 6/1997 | Ono |
| 5,699,449 A | 12/1997 | Javidi |
| 5,784,309 A | 7/1998 | Budil |
| 5,883,743 A | 3/1999 | Sloan |
| 5,953,143 A | 9/1999 | Sharony et al. |
| 6,005,998 A | 12/1999 | Lee |
| 6,060,710 A | 5/2000 | Carrieri et al. |
| 6,178,020 B1 | 1/2001 | Schultz et al. |
| 6,421,163 B1 | 7/2002 | Culver et al. |
| 6,690,853 B1 | 2/2004 | Alaimo et al. |
| 6,728,434 B2 | 4/2004 | Flanders |
| 7,136,587 B1 | 11/2006 | Davis et al. |
| 7,173,272 B2 | 2/2007 | Ralph |
| 7,536,431 B2 | 5/2009 | Goren et al. |
| 7,660,533 B1 | 2/2010 | Meyers et al. |
| 7,876,248 B2 | 1/2011 | Berkley et al. |
| 7,985,965 B2 | 7/2011 | Barker et al. |
| 8,018,244 B2 | 9/2011 | Berkley |
| 8,023,828 B2 | 9/2011 | Beausoleil et al. |
| 8,026,837 B1 | 9/2011 | Valley et al. |
| 8,027,587 B1 | 9/2011 | Watts |
| 8,035,540 B2 | 10/2011 | Berkley et al. |
| 8,129,670 B2 | 3/2012 | Laycock et al. |
| 8,190,553 B2 | 5/2012 | Routt |
| 8,223,414 B2 | 7/2012 | Goto |
| 8,386,899 B2 | 2/2013 | Goto et al. |
| 8,560,282 B2 | 10/2013 | Macready et al. |
| 8,604,944 B2 | 12/2013 | Berkley et al. |
| 8,620,855 B2 | 12/2013 | Bonderson |
| 8,837,544 B2 | 9/2014 | Santori |
| 9,009,560 B1 | 4/2015 | Matache et al. |
| 9,250,391 B2 | 2/2016 | McLaughlin et al. |
| 9,354,039 B2 | 5/2016 | Mower et al. |
| 9,513,276 B2 | 12/2016 | Tearney et al. |
| 9,791,258 B2 | 10/2017 | Mower |
| 10,009,135 B2 | 6/2018 | Tait |
| 10,095,262 B2 | 10/2018 | Valley |
| 10,197,971 B1 | 2/2019 | Horst |
| 10,268,232 B2 | 4/2019 | Harris |
| 10,274,989 B2 | 4/2019 | Andregg |
| 10,345,519 B1 | 7/2019 | Miller |
| 10,359,272 B2 | 7/2019 | Mower |
| 10,382,139 B2 | 8/2019 | Rosenhouse |
| 10,608,663 B2 | 3/2020 | Gould et al. |
| 10,670,860 B2 | 6/2020 | Tait |
| 11,218,227 B2 | 1/2022 | Bunandar et al. |
| 2003/0086138 A1 | 5/2003 | Pittman et al. |
| 2003/0235363 A1 | 12/2003 | Pfeiffer |
| 2003/0235413 A1 | 12/2003 | Cohen et al. |
| 2004/0243657 A1 | 12/2004 | Goren et al. |
| 2005/0036786 A1 | 2/2005 | Ramachandran et al. |
| 2006/0215949 A1 | 9/2006 | Lipson et al. |
| 2007/0180586 A1 | 8/2007 | Amin |
| 2008/0031566 A1 | 2/2008 | Matsubara et al. |
| 2008/0212186 A1 | 9/2008 | Zoller et al. |
| 2008/0212980 A1 | 9/2008 | Weiner |
| 2008/0273835 A1 | 11/2008 | Popovic |
| 2009/0028554 A1 | 1/2009 | Anderson et al. |
| 2010/0165432 A1 | 7/2010 | Laycock et al. |
| 2010/0215365 A1 | 8/2010 | Fukuchi |
| 2013/0011093 A1 | 1/2013 | Goh et al. |
| 2013/0121706 A1 | 5/2013 | Yang et al. |
| 2013/0330076 A1 | 12/2013 | Liboiron-Ladouceur et al. |
| 2014/0003761 A1 | 1/2014 | Dong |
| 2014/0056585 A1 | 2/2014 | Qian et al. |
| 2014/0119393 A1 | 5/2014 | Schleuning et al. |
| 2014/0241657 A1 | 8/2014 | Manouvrier |
| 2014/0299743 A1 | 10/2014 | Miller |
| 2015/0354938 A1 | 12/2015 | Mower et al. |
| 2015/0382089 A1 | 12/2015 | Mazed |
| 2016/0103281 A1 | 4/2016 | Matsumoto |
| 2016/0112129 A1 | 4/2016 | Chang |
| 2016/0118106 A1 | 4/2016 | Yoshimura et al. |
| 2016/0162781 A1 | 6/2016 | Lillicrap et al. |
| 2016/0162798 A1 | 6/2016 | Marandi et al. |
| 2016/0182155 A1 | 6/2016 | Taylor et al. |
| 2016/0245639 A1 | 8/2016 | Mower et al. |
| 2016/0301478 A1 | 10/2016 | Luo et al. |
| 2016/0352515 A1 | 12/2016 | Bunandar et al. |
| 2017/0031101 A1 | 2/2017 | Miller |
| 2017/0201813 A1 | 7/2017 | Sahni |
| 2017/0237505 A1 | 8/2017 | Lucamarini et al. |
| 2017/0285373 A1 | 10/2017 | Zhang et al. |
| 2017/0351293 A1 | 12/2017 | Carolan et al. |
| 2018/0107237 A1 | 4/2018 | Andregg et al. |
| 2018/0274900 A1 | 9/2018 | Mower et al. |
| 2018/0323825 A1 | 11/2018 | Cioffi et al. |
| 2018/0335574 A1 | 11/2018 | Steinbrecher et al. |
| 2019/0110084 A1 | 4/2019 | Jia et al. |
| 2019/0331912 A1 | 10/2019 | Tait et al. |
| 2019/0346685 A1 | 11/2019 | Miller |
| 2019/0354894 A1 | 11/2019 | Lazovich et al. |
| 2019/0356394 A1 | 11/2019 | Bunandar et al. |
| 2019/0370644 A1 | 12/2019 | Kenney et al. |
| 2019/0372589 A1 | 12/2019 | Gould et al. |
| 2020/0272794 A1 | 8/2020 | Kenney et al. |
| 2020/0396007 A1 | 12/2020 | Bunandar et al. |
| 2021/0173238 A1 | 6/2021 | Hosseinzaheh et al. |

FOREIGN PATENT DOCUMENTS

| | | |
|---|---|---|
| WO | WO 2006/023067 A2 | 3/2006 |
| WO | WO 2008/069490 A1 | 6/2008 |

(56) References Cited

FOREIGN PATENT DOCUMENTS

| WO | WO 2018/098230 A1 | 5/2018 |
|---|---|---|
| WO | WO 2019/217835 A1 | 11/2019 |

OTHER PUBLICATIONS

Invitation to Pay Additional Fees mailed Jul. 23, 2019, in connection with International Application No. PCT/US19/32181.
Invitation to Pay Additional Fees mailed Jun. 27, 2019, in connection with International Application No. PCT/US2019/032272.
International Search Report and Written Opinion dated Sep. 4, 2019, in connection with international Application No. PCT/US2019/032272.
International Preliminary Report on Patentability dated Nov. 26, 2020, in connection with International Application No. PCT/US2019/032181.
International Preliminary Report on Patentability dated Dec. 17, 2020, in connection with International Application No. PCT/US2019/032272.
International Search Report and Written Opinion mailed Sep. 23, 2019, in connection with International Application No. PCT/US19/32181.
International Search Report and Written Opinion dated Nov. 29, 2022, in connection with International Application No. PCT/US22/42038.
[No Author Listed], Optical Coherent Receiver Analysis. 2009 Optiwave Systems, Inc. 16 pages. URL:https://dru5cjyjifvrg.cloudfront.net/wp-content/uploads/2017/03/OptiSystem-Applications-Coherent-Receiver-Analysis.pdf [retrieved on Aug. 17, 2019].
Aaronson et al., Computational complexity of linear optics. Proceedings of the 43rd Annual ACM Symposium on Theory of Computing. 2011. 101 pages. ISBN 978-1-4503-0691-1.
Abu-Mostafa et al., Optical neural computers. Scientific American 256.3 (1987):88-95.
Albert et al., Statistical mechanics of com-plex networks. Reviews of Modern Physics. 2002;(74):47-97.
Almeida et al., All-optical control of light on a silicon chip. Nature. 2004;431:1081-1084.
Amir et al., Classical diffusion of a quantum particle in a noisy environment. Physical Review E. 2009;79. 5 pages. DOI: 10.1103/PhysRevE.79.050105.
Amit et al., Spin-glass models of neural networks. Physical Review A. 1985;32(2):1007-1018.
Anitha et al., Comparative Study of High performance Braun's multiplier using FPGAs. IOSR Journal of Electrontrics and Communication Engineering (IOSRJECE). 2012;1:33-37.
Appeltant et al., Information processing using a single dynamical node as complex system. Nature Communications. 2011, 6 pages. DOI: 10.1038/ncomms1476.
Arjovsky et al., Unitary Evolution Recurrent Neural Networks. arXiv:1511.06464. 2016. 9 pages.
Aspuru-Guzik et al., Photonic quantum simulators. Nature Physics. 2012;8:285-291. DOI: 10.1038/NPHYS2253.
Aspuru-Guzik et al., Simulated Quantum Computation of Molecular Energies. Science. 2005;309:1704-7.
Atabaki et al., Integrating photonics with silicon nanoelectronics for the next generation of systems on a chip. Nature. 2018;556(7701):349-354. 10 pages. DOI: 10.1038/s41586-018-0028-z.
Baehr-Jones et al., A 25 Gb/s Silicon Photonics Platform. arXiv:1203.0767. 2012. 11 pages.
Bao et al., Atomic-Layer Graphene as a Saturable Absorber for Ultrafast Pulsed Lasers. 24 pages. 2009.
Bao et al., Monolayer graphene as a saturable absorber in a mode-locked laser. Nano Research. 2011;4:297-307. DOI: 10.1007/s12274-010-0082-9.
Barahona, On the computational complexity of Ising spin glass models. Journal of Physics A: Mathematical and General. 1982;15:3241-3253.
Bertsimas et al., Robust optimization with simulated annealing. Journal of Global Optimization. 2010;48:323-334. DOI 10.1007/s10898-009-9496-x.
Bewick, Fast multiplication: algorithms and implementation. Ph.D. thesis, Stanford University (1994). 170 pages.
Bonneau et al., Quantum interference and manipulation of entanglement in silicon wire waveguide quantum circuits. New Journal of Physics. 2012;14:045003. 13 pages. DOI: 10.1088/1367-2630/14/4/045003.
Brilliantov, Effective magnetic Hamiltonian and Ginzburg criterion for fluids. Physical Review E. 1998;58:2628-2631.
Bromberg et al., Bloch oscillations of path-entangled photons. Physical Review Letters. 2010;105:263604-1-2633604-4. 4 pages. DOI: 10.1103/PhysRevLett.105.263604.
Bromberg et al., Quantum and Classical Correlations in Waveguide Lattices. Physical Review Letters. 2009; 102:253904-1-253904-4. 4 pages. DOI: 10.1103/PhysRevLett.102.253904.
Broome et al., Photonic Boson Sampling in a Tunable Circuit. Science. 2012;339:794-8.
Bruck et al., On the power of neural networks for solving hard problems. American Institute of Physics. 1988. pp 137-143. 7 pages.
Canziani et al., Evaluation of neural network architectures for embedded systems. Circuits and Systems (ISCAS). 2017 IEEE International Symposium. 4 pages.
Cardenas et al., Low loss etchless silicon photonic waveguides. Optics Express. 2009;17(6):4752-4757.
Carolan et al., Universal linear optics. Science. 2015;349:711-716.
Caves, Quantum-mechanical noise in an interferometer. Physical Review D. 1981;23(8):1693-1708. 16 pages.
Centeno et al., Optical bistability in finite-size nonlinear bidimensional photonic crystals doped by a microcavity. Physical Review B. 2000;62(12):R7683-R7686.
Chan, Optical flow switching networks. Proceedings of the IEEE. 2012;100(5):1079-1091.
Chen et al., Compact, low-loss and low-power 8×8 broadband silicon optical switch. Optics Express. 2012;20(17):18977-18985.
Chen et al., DianNao: A small-footprint high-throughput accelerator for ubiquitous machine-learning. ACM Sigplan Notices. 2014;49:269-283.
Chen et al., Efficient photon pair sources based on silicon-on-insulator microresonators. Proc. of SPIE. 2010;7815. 10 pages.
Chen et al., Frequency-bin entangled comb of photon pairs from a Silicon-on-Insulator micro-resonator. Optics Express. 2011;19(2):1470-1483.
Chen et al., Universal method for constructing N-port nonblocking optical router based on 2×2 optical switch for photonic networks-on-chip. Optics Express. 2014;22(10);12614-12627. DOI: 10.1364/OE.22.012614.
Cheng et al., In-Plane Optical Absorption and Free Carrier Absorption in Graphene-on-Silicon Waveguides. IEEE Journal of Selected Topics in Quantum Electronics. 2014;20(1). 6 pages.
Chetlur et al., cuDNN: Efficient primitives for deep learning. arXiv preprint arXiv:1410.0759. 2014. 9 pages.
Childs et al., Spatial search by quantum walk. Physical Review A. 2004;70(2):022314. 11 pages.
Chung et al., A monolithically integrated large-scale optical phased array in silicon-on-insulator cmos. IEEE Journal of Solid-State Circuits. 2018;53:275-296.
Cincotti, Prospects on planar quantum computing. Journal of Lightwave Technology. 2009;27(24):5755-5766.
Clements et al., Optimal design for universal multiport interferometers. Optica. 2016;3(12):1460-1465.
Crespi et al., Integrated multimode interferometers with arbitrary designs for photonic boson sampling. Nature Photonics. 2013;7:545-549. DOI: 10.1038/NPHOTON.2013.112.
Crespi, et al., Anderson localization of entangled photons in an integrated quantum walk. Nature Photonics. 2013;7:322-328. DOI: 10.1038/NPHOTON.2013.26.
Dai et al., Novel concept for ultracompact polarization splitter-rotator based on silicon nanowires. Optics Express. 2011;19(11):10940-9.

(56) References Cited

OTHER PUBLICATIONS

Di Giuseppe et al., Einstein-Podolsky-Rosen Spatial Entanglement in Ordered and Anderson Photonic Lattices. Physical Review Letters. 2013;110:150503-1-150503-5. DOI: 10.1103/PhysRevLett.110.150503.

Dunningham et al., Efficient comparison of path-lengths using Fourier multiport devices. Journal of Physics B: Atomic, Molecular and Optical Physics. 2006;39:1579-1586. DOI:10.1088/0953-4075/39/7/002.

Esser et al., Convolutional networks for fast, energy-efficient neuromorphic computing. Proceedings of the National Academy of Sciences. 2016;113(41):11441-11446.

Farhat et al., Optical implementation of the Hopfield model. Applied Optics. 1985;24(10):1469-1475.

Feinberg et al., Making memristive neural network accelerators reliable. IEEE International Symposium on High Performance Computer Architecture (HPCA). 2018. pp. 52-65. DOI 10.1109/HPCA.2018.00015.

Fushman et al., Controlled Phase Shifts with a Single Quantum Dot. Science. 2008;320:769-772. DOI: 10.1126/science.1154643.

George et al., A programmable and configurable mixed-mode FPAA SoC. IEEE Transactions on Very Large Scale Integration (VLSI) Systems. 2016;24:2253-2261.

Gilmer et al., Neural message passing for quantum chemistry. arXiv preprint arXiv: 1704.01212. Jun. 2017. 14 pages.

Golub et al., Calculating the singular values and pseudo-inverse of a matrix. Journal of the Society for Industrial and Applied Mathematics Series B Numerical Analysis. 1965;2(2):205-224.

Graves et al., Hybrid computing using a neural network with dynamic external memory. Nature. 2016;538. 21 pages. DOI:10.1038/nature20101.

Grote et al., First long-term application of squeezed states of light in a gravitational-wave observatory. Physical Review Letter. 2013;110:181101. 5 pages. DOI: 10.1103/PhysRevLett.110.181101.

Gruber et al., Planar-integrated optical vector-matrix multiplier. Applied Optics. 2000;39(29):5367-5373.

Gullans et al., Single-Photon Nonlinear Optics with Graphene Plasmons. Physical Review Letter. 2013;111:247401-1-247401-5. DOI: 10.1103/PhysRevLett.111.247401.

Gunn, CMOS photonics for high-speed interconnects. IEEE Micro. 2006;26:58-66.

Haffner et al., Low-loss plasmon-assisted electro-optic modulator. Nature. 2018;556:483-486. 17 pages. DOI: 10.1038/s41586-018-0031-4.

Halasz et al., Phase diagram of QCD. Physical Review D. 1998;58:096007. 11 pages.

Hamerly et al., Scaling advantages of all-to-all connectivity in physical annealers: the Coherent Ising Machine vs. D-Wave 2000Q. arXiv preprints, May 2018. 17 pages.

Harris et al. Efficient, Compact and Low Loss Thermo-Optic Phase Shifter in Silicon. Optics Express. 2014;22(9);10487-93. DOI:10.1364/OE.22.010487.

Harris et al., Bosonic transport simulations in a large-scale programmable nanophotonic processor. arXiv:1507.03406. 2015. 8 pages.

Harris et al., Integrated source of spectrally filtered correlated photons for large-scale quantum photonic systems. Physical Review X. 2014;4:041047. 10 pages. DOI: 10.1103/PhysRevX.4.041047.

Harris et al., Quantum transport simulations in a programmable nanophotonic processor. Nature Photonics. 2017;11:447-452. DOI: 10.1038/NPHOTON.2017.95.

Hinton et al., Reducing the dimensionality of data with neural networks. Science. 2006;313:504-507.

Hochberg et al., Silicon Photonics: The Next Fabless Semiconductor Industry. IEEE Solid-State Circuits Magazine. 2013. pp 48-58. DOI: 10.1109/MSSC.2012.2232791.

Honerkamp-Smith et al., An introduction to critical points for biophysicists; observations of compositional heterogeneity in lipid membranes. Biochimica et Biophysica Acta (BBA). 2009;1788:53-63. DOI: 10.1016/j.bbamem.2008.09.010.

Hong et al., Measurement of subpicosecond time intervals between two photons by interference. Physical Review Letters. 1987;59(18):2044-2046.

Hopfield et al., Neural computation of decisions in optimization problems. Biological Cybernetics. 1985;52;141-152.

Hopfield, Neural networks and physical systems with emergent collective computational abilities. PNAS. 1982;79:2554-2558. DOI: 10.1073/pnas.79.8.2554.

Horowitz, Computing's energy problem (and what we can do about it). Solid-State Circuits Conference Digest of Technical Papers (ISSCC), 2014 IEEE International. 5 pages.

Horst et al., Cascaded Mach-Zehnder wavelength filters in silicon photonics for low loss and flat pass-band WDM (de-)multiplexing. Optics Express. 2013;21(10):11652-8. DOI:10.1364/OE.21.011652.

Humphreys et al., Linear Optical Quantum Computing in a Single Spatial Mode. Physical Review Letters. 2013;111:150501. 5 pages. DOI: 10.1103/PhysRevLett.111.150501.

Inagaki et al., Large-scale ising spin network based on degenerate optical parametric oscillators. Nature Photonics. 2016; 10:415-419. 6 pages. DOI: 10.1038/NPHOTON.2016.68.

Isichenko, Percolation, statistical topography, and trans-port in random media. Reviews of Modem Physics. 1992;64(4):961-1043.

Jaekel et al., Quantum limits in interferometric measurements. Europhysics Letters. 1990;13(4):301-306.

Jalali et al., Silicon Photonics. Journal of Lightwave Technology. 2006;24(12):4600-15. DOI: 10.1109/JLT.2006.885782.

Jia et al., Caffe: Convolutional architecture for fast feature embedding. Proceedings of the 22nd ACM International Conference on Multimedia. Nov. 2014. 4 pages. URL:http://doi.acm.org/10.1145/2647868.2654889.

Jiang et al., A planar ion trapping microdevice with integrated waveguides for optical detection. Optics Express. 2011;19(4):3037-43.

Jonsson, An empirical approach to finding energy efficient ADC architectures. 2011 International Workshop on ADC Modelling, Testing and Data Converter Analysis and Design and IEEE 2011 ADC Forum. 6 pages.

Jouppi et al. In-datacenter performance analysis of a tensor processing unit. Proceeding of Computer Architecture (ISCA). Jun. 2017. 12 pages. URL:https://doi.org/10.1145/3079856.3080246.

Kahn et al., Communications expands its space. Nature Photonics. 2017;11:5-8.

Kardar et al., Dynamic Scaling of Growing Interfaces. Physical Review Letters. 1986;56(9):889-892.

Karpathy, CS23 In Convolutional Neural Networks for Visual Recognition. Class notes. 2019. URL:http://cs231n.github.io/ 2 pages, [last accessed Sep. 24, 2019].

Kartalopoulos, Part III Coding Optical Information. Introduction to DWDM Technology. IEEE Press. 2000. pp. 165-166.

Keckler et al., GPUs and the future of parallel computing. IEEE Micro. 2011;31:7-17. DOI: 10.1109/MM.2011.89.

Kieling et al., On photonic Controlled Phase Gates. New Journal of Physics. 2010;12:0133003. 17 pages. DOI: 10.1088/1367-2630/12/1/013003.

Kiiper et al., Optical networks come of age. Optics Photonics News. 2014;25:50-57. DOI: 10.1364/OPN.25.9.000050.

Kim et al., A functional hybrid memristor crossbar-array/cmos system for data storage and neuromorphic applications. Nano Letters. 2011;12:389-395.

Kirkpatrick et al., Optimization by simulated annealing. Science. 1983;220(4598):671-680.

Knill et al., A scheme for efficient quantum computation with linear optics. Nature. 2001;409(4652):46-52.

Knill et al., The Bayesian brain: the role of uncertainty in neural coding and computation. Trends in Neurosciences. 2004;27(12):712-719.

Knill, Quantum computing with realistically noisy devices. Nature. 2005;434:39-44.

Kok et al., Linear optical quantum computing with photonic qubits. Reviews of Modern Physics. 2007;79(1):135-174.

(56) References Cited

OTHER PUBLICATIONS

Koos et al., Silicon-organic hybrid (SOH) and plasmonic-organic hybrid (POH) integration. Journal of Lightwave Technology. 2016;34(2):256-268.
Krizhevsky et al., ImageNet classification with deep convolutional neural networks. Advances in Neural Information Processing Systems (NIPS). 2012. 9 pages.
Kucherenko et al., Application of Deterministic Low-Discrepancy Sequences in Global Optimization. Computational Optimization and Applications. 2005;30:297-318.
Kwack et al., Monolithic InP strictly non-blocking 8×8 switch for high-speed WDM optical interconnection. Optics Express. 2012;20(27):28734-41.
Lahini et al., Anderson Localization and Nonlinearity in One-Dimensional Disordered Photonic Lattices. Physical Review Letters. 2008;100:013906. 4 pages. DOI: 10.1103/PhysRevLett.100.013906.
Lahini et al., Quantum Correlations in Two-Particle Anderson Localization. Physical Review Letters. 2010;105:163905. 4 pages. DOI: 10.1103/PhysRevLett.105.163905.
Laing et al., High-fidelity operation of quantum photonic circuits. Applied Physics Letters. 2010;97:211109. 5 pages. DOI: 10.1063/1.3497087.
Landauer, Irreversibility and heat generation in the computing process. IBM Journal of Research and Development. 1961. pp. 183-191.
Lanyon et al., Towards quantum chemistry on a quantum computer. Nature Chemistry. 2010;2:106-10. DOI: 10.1038/NCHEM.483.
Lawson et al., Basic linear algebra subprograms for Fortran usage. ACM Transactions on Mathematical Software (TOMS). 1979;5(3):308-323.
Lecun et al., Deep learning. Nature. 2015;521:436-444. DOI:10.1038/nature14539.
Lecun et al., Gradient-based learning applied to document recognition. Proceedings of the IEEE. Nov. 1998, 46 pages.
Levi et al., Hyper-transport of light and stochastic acceleration by evolving disorder. Nature Physics. 2012;8:912-7. DOI: 10.1038/NPHYS2463.
Li et al., Efficient and self-adaptive in-situ learning in multilayer memristor neural networks. Nature Communications. 2018;9:2385. 8 pages. doi: 10.1038/s41467-018-04484-2.
Lin et al., All-optical machine learning using diffractive deep neural networks. Science. 2018;361:1004-1008. 6 pages. doi: 10.1126/science.aat8084.
Little, The existence of persistent states in the brain. Mathematical Biosciences. 1974;19:101-120.
Liu et al., Towards 1-Tb/s Per-Channel Optical Transmission Based on Multi-Carrier Modulation. 19th Annual Wireless and Optical Communications Conference. May 2010. 4 pages. DOI: 10.1109/WOCC.2010.5510630.
Lu et al., 16×16 non-blocking silicon optical switch based on electro-optic Mach-Zehnder interferometers. Optics Express. 2016:24(9):9295-9307, DOI: 10.1364/OE.24.009295.
Ma et al., Optical switching technology comparison: Optical mems vs. Other technologies. IEEE Optical Communications. 2003;41(11):S16-S23.
MacReady et al., Criticality and Parallelism in Combinatorial Optimization. Science. 1996;271:56-59.
Marandi et al., Network of time-multiplexed optical parametric oscillators as a coherent Ising machine. Nature Photonics. 2014;8:937-942. doi: 10.1038/NPHOTON.2014.249.
Martin-Lopez et al., Experimental realization of Shor's quantum factoring algorithm using qubit recycling. Nature Photonics. 2012;6:773-6. DOI: 10.1038/NPHOTON.2012.259.
McMahon et al., A fully programmable 100-spin coherent Ising machine with all-to-all connections. Science. 2016;354(6312):614-7. DOI: 10.1126/science.aah5178.
Mead, Neuromorphic electronic systems. Proceedings of the IEEE. 1990;78(10):1629-1636.
Migdall et al., Tailoring single-photon and multiphoton probabilities of a single-photon on-demand source. Physical Review A. 2002;66:053805. 4 pages. DOI: 10.1103/PhysRevA.66.053805.
Mikkelsen et al., Dimensional variation tolerant silicon-on-insulator directional couplers. Optics Express. 2014;22(3):3145-50. DOI:10.1364/OE.22.003145.
Miller, Are optical transistors the logical next step? Nature Photonics. 2010;4:3-5.
Miller, Attojoule optoelectronics for low-energy information processing and communications. Journal of Lightwave Technology. 2017;35(3):346-96. DOI: 10.1109/JLT.2017.2647779.
Miller, Energy consumption in optical modulators for interconnects. Optics Express. 2012;20(S2):A293-A308.
Miller, Perfect optics with imperfect components. Optica. 2015;2(8):747-750.
Miller, Reconfigurable add-drop multiplexer for spatial modes. Optics Express. 2013;21(17):20220-9. DOI:10.1364/OE.21.020220.
Miller, Self-aligning universal beam coupler, Optics Express. 2013;21(5):6360-70.
Miller, Self-configuring universal linear optical component [Invited]. Photonics Research. 2013;1(1):1-15. URL:http://dx.doi.org/10.1364/PRJ.1.000001.
Misra et al., Artificial neural networks in hardware: A survey of two decades of progress. Neurocomputing. 2010;74:239-255.
Mohseni et al., Environment-assisted quantum walks in photosynthetic complexes. The Journal of Chemical Physics. 2008;129:174106. 10 pages. DOI: 10.1063/1.3002335.
Moore, Cramming more components onto integrated circuits. Proceeding of the IEEE. 1998;86(1):82-5.
Mower et al., Efficient generation of single and entangled photons on a silicon photonic integrated chip. Physical Review A. 2011;84:052326. 7 pages. DOI: 10.1103/PhysRevA.84.052326.
Mower et al., High-fidelity quantum state evolution in imperfect photonic integrated circuits. Physical Review A. 2015;92(3):032322. 7 pages. doi: 10.1103/PhysRevA.92.032322.
Nagamatsu et al., A 15 NS 32×32-bit CMOS multiplier with an improved parallel structure. IEEE Custom Integrated Circuits Conference. 1989. 4 pages.
Najafi et al., On-Chip Detection of Entangled Photons by Scalable Integration of Single-Photon Detectors. arXiv:1405.4244. May 16, 2014. 27 pages.
Najafi et al., On-Chip detection of non-classical light by scalable integration of single-photon detectors. Nature Communications. 2015;6:5873. 8 pages. DOI: 10.1038/ncomms6873.
Naruse, Nanophotonic Information Physics. Nanointelligence and Nanophotonic Computing. Springer. 2014. 261 pages. DOI 10.1007/978-3-642-40224-1.
Nozaki et al., Sub-femtojoule all-optical switching using a photonic-crystal nanocavity. Nature Photonics. 2010;4:477-483. doi: 10.1038/NPHOTON.2010.89.
O'Brien et al., Demonstration of an all-optical quantum controlled-NOT gate. Nature. 2003;426:264-7.
Onsager, Crystal Statistics. I. A Two-Dimensional Model with an Order-Disorder Transition. Physical Review. 1944;65(3,4):117-149.
Orcutt et al., Nanophotonic integration in state-of-the-art CMOS foundries. Optics Express. 2011;19(3):2335-46.
Pelissetto et al., Critical phenomena and renormalization-group theory. Physics Reports. Apr. 2002, 150 pages.
Peng, Implementation of AlexNet with Tensorflow. https://github.com/ykpengba/AlexNet-A-Practical-Implementation, 2018, 2 pages, [last accessed Sep. 24, 2019].
Peretto, Collective properties of neural networks: A statistical physics approach. Biological Cybernetics. 1984;50:51-62.
Pernice et al., High-speed and high-efficiency travelling wave single-photon detectors embedded in nanophotonic circuits. Nature Communications 2012;3:1325. 10 pages. DOI: 10.1038/ncomms2307.
Peruzzo et al., Quantum walk of correlated photons. Science. 2010;329;1500-3. DOI: 10.1126/science.1193515.
Politi et al., Integrated Quantum Photonics, IEEE Journal of Selected Topics in Quantum Electronics, 2009;5(6):1-12. DOI: 10.1109/JSTQE.2009.2026060.

(56) References Cited

OTHER PUBLICATIONS

Politi et al., Silica-on-Silicon Waveguide Quantum Circuits. Science. 2008;320:646-9. DOI: 10.1126/science.1155441.

Poon et al., Neuromorphic silicon neurons and large-scale neural networks: challenges and opportunities. Frontiers in Neuroscience. 2011;5:1-3. doi: 10.3389/fnins.2011.00108.

Prucnal et al., Recent progress in semiconductor excitable lasers for photonic spike processing. Advances in Optics and Photonics. 2016;8(2):228-299.

Psaltis et al., Holography in artificial neural networks. Nature. 1990;343:325-330.

Qiao et al., 16×16 non-blocking silicon electro-optic switch based on mach zehnder interferometers. Optical Fiber Communication Conference. Optical Society of America. 2016. 3 pages.

Ralph et al., Linear optical controlled-NOT gate in the coincidence basis. Physical Review A. 2002;65:062324-1-062324-5. DOI: 10.1103/PhysRevA.65.062324.

Ramanitra et al., Scalable and multi-service passive optical access infrastructure using variable optical splitters. Optical Fiber Communication Conference. Optical Society of America. 2005. 3 pages.

Raussendorf et al., A one-way quantum computer. Physical Review Letter. 2001;86(22):5188-91. DOI: 10.1103/PhysRevLett.86.5188.

Rechtsman et al., Photonic floquet topological insulators. Nature. 2013;496:196-200. doi: 10.1038/nature12066.

Reck et al., Experimental realization of any discrete unitary operator. Physical review letters. 1994;73(1):58-61. 6 pages.

Reed et al., Silicon optical modulators. Nature Photonics. 2010;4:518-26. DOI: 10.1038/NPHOTON.2010.179.

Rendl et al., Solving Max-Cut to optimality by intersecting semidefinite and polyhedral relaxations. Mathematical Programming. 2010;121:307-335. doi: 10.1007/s10107-008-0235-8.

Rios et al., Integrated all-photonic non-volatile multilevel memory. Nature Photonics. 2015;9:725-732. doi: 10.1038/NPHOTON.2015.182.

Rogalski, Progress in focal plane array technologies. Progress in Quantum Electronics. 2012;36:342-473.

Rohit et al., 8×8 space and wavelength selective cross-connect for simultaneous dynamic multi-wavelength routing. Optical Fiber Communication Conference. OFC/NFOEC Technical Digest. 2013. 3 pages.

Rosenblatt, The perceptron: a probabilistic model for information storage and organization in the brain. Psychological Review. 1958;65(6):386-408.

Russakovsky et al., ImageNet Large Scale Visual Recognition Challenge. arXiv:1409.0575v3. Jan. 2015, 43 pages.

Saade et al., Random projections through multiple optical scattering: Approximating Kernels at the speed of light. arXiv:1510.06664v2. Oct. 25, 2015, 6 pages.

Salandrino et al., Analysis of a three-core adiabatic directional coupler. Optics Communications. 2009;282:4524-6. doi:10.1016/j.optcom.2009.08.025.

Schaeff et al., Scalable fiber integrated source for higher-dimensional path-entangled photonic quNits. Optics Express. 2012;20(15):16145-153.

Schirmer et al., Nonlinear mirror based on two-photon absorption. Journal of the Optical Society of America B. 1997;14(11):2865-8.

Schmidhuber, Deep learning in neural networks: An overview. Neural Networks. 2015;61:85-117.

Schreiber et al., Decoherence and Disorder in Quantum Walks: From Ballistic Spread to Localization. Physical Review Letters. 2011;106:180403. 4 pages. DOI: 10.1103/PhysRevLett.106.180403.

Schwartz et al., Transport and Anderson localization in disordered two-dimensional photonic lattices. Nature. 2007;446:52-5. doi:10.1038/nature05623.

Selden, Pulse transmission through a saturable absorber. British Journal of Applied Physics. 1967;18:743-8.

Shafiee et al., Isaac: A convolutional neural network accelerator with in-situ analog arithmetic in crossbars. ACM/IEEE 43rd Annual International Symposium on Computer Architecture. Oct. 2016, 13 pages.

Shen et al., Deep learning with coherent nanophotonic circuits. Nature Photonics. 2017;11:441-6. DOI: 10.1038/NPHOTON.2017.93.

Shoji et al., Low-crosstalk 2×2 thermo-optic switch with silicon wire waveguides. Optics Express.2010; 18(9):9071-5.

Silver et al. Mastering chess and shogi by self-play with a general reinforcement learning algorithm. arXiv preprint arXiv:1712.01815. 19 pages. 2017.

Silver et al., Mastering the game of go with deep neural networks and tree search. Nature. 2016;529:484-9. 20 pages. doi: 10.1038/nature16961.

Silver et al., Mastering the game of Go without human knowledge. Nature. 2017;550:354-9. 18 pages. doi: 10.1038/nature24270.

Silverstone et al., On-chip quantum interference between silicon photon-pair sources. Nature Photonics. 2014;8:104-8. DOI: 10.1038/NPHOTON.2013.339.

Smith et al., Phase-controlled integrated photonic quantum circuits. Optics Express. 2009;17(16):13516-25.

Soljacic et al., Optimal bistable switching in nonlinear photonic crystals. Physical Review E. vol. 66, p. 055601, Nov. 2002, 4 pages.

Solli et al., Analog optical computing. Nature Photonics. 2015;9:704-6.

Spring et al., Boson sampling on a photonic chip. Science. 2013;339:798-801. DOI: 10.1126/science.1231692.

Srinivasan et al., 56 GB/s germanium waveguide electro-absorption modulator. Journal of Lightwave Technology. 2016;34(2):419-24. DOI: 10.1109/JLT.2015.2478601.

Steinkraus et al., Using GPUs for machine learning algorithms. Proceedings of the 2005 Eight International Conference on Document Analysis and Recognition. 2005. 6 pages.

Suda et al., Quantum interference of photons in simple networks. Quantum Information Process. 2013; 12:1915-45. DOI 10.1007/s11128-012-0479-3.

Sun et al., Large-scale nanophotonic phased array. Nature. 2013;493:195-9. doi:10.1038/nature11727.

Sun et al., Single-chip microprocessor that communicates directly using light. Nature. 2015;528:534-8. doi:10.1038/nature16454.

Suzuki et al., Ultra-compact 8×8 strictly-non-blocking Si-wire PILOSS switch. Optics Express. 2014;22(4):3887-94. DOI: 10.1364/OE.22.003887.

Sze et al., Efficient processing of deep neural networks: A tutorial and survey. Proceedings of the IEEE. 2017;105(12):2295-2329. DOI: 10.1109/JPROC.2017.276174.

Tabia, Experimental scheme for qubit and qutrit symmetric informationally complete positive operator-valued measurements using multiport devices. Physical Review A. 2012;86:062107. 8 pages. DOI: 10.1103/PhysRevA.86.062107.

Tait et al., Broadcast and weight: An integrated network for scalable photonic spike processing. Journal of Lightwave Technology. 2014;32(21):3427-39. DOI: 10.1109/JLT.2014.2345652.

Tait et al., Chapter 8 Photonic Neuromorphic Signal Processing and Computing. Springer, Berlin, Heidelberg. 2014. pp. 183-222.

Tait et al., Neuromorphic photonic networks using silicon photonic weight banks. Scientific Reports. 2017;7:7430. 10 pages.

Tanabe et al., Fast bistable all-optical switch and memory on a silicon photonic crystal on-chip. Optics Letters. 2005;30(19):2575-7.

Tanizawa et al., Ultra-compact 32×32 strictly-non-blocking Si-wire optical switch with fan-out LGA interposer. Optics Express. 2015;23(13):17599-606, DOI:10.1364/OE.23.017599.

Thompson et al., Integrated waveguide circuits for optical quantum computing. IET Circuits, Devices, & Systems. 2011;5(2):94-102. doi: 10.1049/iet-cds.2010.0108.

Timurdogan et al., An ultralow power athermal silicon modulator. Nature Communications. 2014;5:4008. 11 pages. DOI: 10.1038/ncomms5008.

Vandoorne et al., Experimental demonstration of reservoir computing on a silicon photonics chip. Nature Communications. 2014;5:3541. 6 pages. DOI: 10.1038/ncomms4541.

(56) References Cited

OTHER PUBLICATIONS

Vazquez et al., Optical NP problem solver on laser-written waveguide plat-form. Optics Express. 2018;26(2):702-10.

Vivien et al., Zero-bias 40gbit/s germanium waveguide photodetector on silicon. Optics Express. 2012;20(2):1096-1101.

Wang et al., Coherent Ising machine based on degenerate optical parametric oscillators. Physical Review A. 2013;88:063853. 9 pages. DOI: 10.1103/PhysRevA.88.063853.

Wang et al., Deep learning for identifying metastatic breast cancer. arXiv preprint arXiv: 1606.05718, Jun. 18, 2016, 6 pages.

Werbos, Beyond regression: New tools for prediction and analysis in the behavioral sciences. Ph.D. dissertation, Harvard University. Aug. 1974, 454 pages.

Whitfield et al., Simulation of electronic structure Hamiltonians using quantum computers. Molecular Physics. 2010;109(5,10):735-50. DOI: 10.1080/00268976.2011.552441.

Wu et al., An optical fiber network oracle for NP-complete problems. Light: Science & Applications. 2014;3: e149 47, 5 pages. DOI: 10,1038/lsa.2014.28.

Xia et al., Mode conversion losses in silicon-on-insulator photonic wire based racetrack resonators. Optics Express. 2006;14(9):3872-86.

Xu et al., Experimental observations of bistability and instability in a two-dimensional nonlinear optical superlattice. Physical Review Letters. 1993;71(24):3959-62.

Yang et al., Non-Blocking 4×4 Electro-Optic Silicon Switch for On-Chip Photonic Networks. Optics Express 2011;19(1):47-54.

Yao et al., Serial-parallel multipliers. Proceedings of 27th Asilomar Conference on Signals, Systems and Computers. 1993. pp. 359-363.

Young et al., Recent trends in deep learning based natural language processing. IEEE Computational Intelligence Magazine. arXiv: 1708.02709v8. Nov. 2018, 32 pages.

Zhou et al., Calculating Unknown Eigenvalues with a Quantum Algorithm. Nature Photonics. 2013;7:223-8. DOI: 10.1038/NPHOTON.2012.360.

PCT/US19/32181, Jul. 23, 2019, Invitation to Pay Additional Fees.

PCT/US19/32181, Sep. 23, 2019, International Search Report and Written Opinion.

PCT/US2015/034500, Mar. 15, 2016, International Search Report and Written Opinion.

PCT/US2019/032181, Nov. 26, 2020, International Preliminary Report on Patentability.

PCT/US2019/032272, Jul. 27, 2019, Invitation to Pay Additional Fees.

PCT/US2019/032272, Sep. 4, 2019, International Search Report and Written Opinion.

PCT/US2019/032272, Dec. 17, 2020, International Preliminary Report on Patentability.

PCT/US22/42038, Nov. 29, 2022, International Search Report and Written Opinion.

FIBER-COUPLED LASER LIGHT SOURCE

CROSS-REFERENCE TO RELATED APPLICATION

This application claims the benefit under 35 U.S.C. § 119(e) of U.S. Provisional Patent Application Ser. No. 63/239,337, entitled "FIBER-COUPLED LASER LIGHT SOURCE," filed on Aug. 31, 2021, which is hereby incorporated herein by reference in its entirety.

BACKGROUND

Deep learning, machine learning, latent-variable models, neural networks and other matrix-based differentiable programs are used to solve a variety of problems, including natural language processing and object recognition in images. Solving these problems with deep neural networks typically requires long processing times to perform the required computation. The conventional approach to speed up deep learning algorithms has been to develop specialized hardware architectures. This is because conventional computer processors, e.g., central processing units (CPUs), which are composed of circuits including hundreds of millions of transistors to implement logical gates on bits of information represented by electrical signals, are designed for general purpose computing and are therefore not optimized for the particular patterns of data movement and computation required by the algorithms that are used in deep learning and other matrix-based differentiable programs. One conventional example of specialized hardware for use in deep learning are graphics processing units (GPUs) having a highly parallel architecture that makes them more efficient than CPUs for performing image processing and graphical manipulations. After their development for graphics processing, GPUs were found to be more efficient than CPUs for other parallelizable algorithms, such as those used in neural networks and deep learning. This realization, and the increasing popularity of artificial intelligence and deep learning, led to further research into new electronic circuit architectures that could further enhance the speed of these computations.

Deep learning using neural networks conventionally requires two stages: a training stage and an evaluation stage (sometimes referred to as "inference"). Before a deep learning algorithm can be meaningfully executed on a processor, e.g., to classify an image or speech sample, during the evaluation stage, the neural network must first be trained. The training stage can be time consuming and requires intensive computation.

SUMMARY OF THE DISCLOSURE

Some embodiments relate to a computer comprising a photonic accelerator configured to perform matrix multiplication; a fiber array optically coupled to the photonic accelerator; and a photonic source optically coupled to the fiber array, the photonic source comprising: a laser array comprising a plurality of monolithically co-integrated lasers; and a coupling lens array comprising a plurality of monolithically co-integrated lenses, the coupling lens array optically coupling the laser array to the fiber array.

In some embodiments, the laser array is configured to emit between 0.1 W and 10 W of optical power.

In some embodiments, the photonic source further comprises a volume Bragg grating (VBG) optically coupled between the laser array and the coupling lens array, the VBG having a passband bandwidth of less than 1 nm.

In some embodiments, the photonic source further comprises an optical isolator optically coupled between the laser array and the coupling lens array, the optical isolator being configured to permit transmission of a plurality of optical beams emitted by the laser array.

In some embodiments, the optical isolator comprises a first magnet embedded in a first magnet retainer; a second magnet embedded in a second magnet retainer; and a mount joining the first magnet retainer with the second magnet retainer.

In some embodiments, the optical isolator further comprises an angled half-wave plate disposed between the first magnet and the second magnet.

In some embodiments, the optical isolator further comprises a plate having a rare-earth iron garnet (RIG) film disposed between the first magnet and the second magnet.

In some embodiments, the photonic source further comprises a steering lens array comprising a plurality of monolithically co-integrated lenses, wherein the steering lens array is coupled between the laser array and the coupling lens array and is laterally offset relative to the coupling lens array.

In some embodiments, the photonic source further comprises a collimating lens array comprising a plurality of monolithically co-integrated lenses, wherein the lenses of the collimating lens array are configured to collimate optical beams emitted by the laser array.

In some embodiments, at least some of the monolithically co-integrated lasers are vertically offset relative to one another thereby defining a vertical extension, the collimating lens array defines a mid-array axis with respect to a vertical direction, and the mid-array axis falls within the vertical extension with respect to the vertical direction.

In some embodiments, the optical source further comprises a housing frame defining a first cavity, a second cavity and an enclosed window between the first cavity and the second cavity, wherein the laser array is disposed within the first cavity and the coupling lens array is disposed within the second cavity.

In some embodiments, the housing frame further defines a step between the first cavity and the second cavity.

In some embodiments, the housing frame is positioned so that optical beams emitted by the laser array pass through the window.

In some embodiments, the optical source further comprises a water-cooled heat sink configured to cool the laser array.

Some embodiments relate to a method for manufacturing a computer, comprising obtaining a photonic accelerator configured to perform matrix multiplication; obtaining a laser array comprising a plurality of monolithically co-integrated lasers; obtaining a coupling lens array comprising a plurality of monolithically co-integrated lenses; assembling a laser source using the laser array and the lens array, wherein assembling the laser source comprises optically aligning the lasers of the laser array with the lenses of the coupling lens array; and optically coupling a first end of a fiber array to the photonic accelerator and optically coupling a second end of the fiber array to the coupling lens array.

In some embodiments, the laser array is configured to output between 0.1 W and 10 W of optical power.

In some embodiments, assembling the photonic source further comprises optically coupling the laser array with a Volume Bragg Grating (VBG) having a passband bandwidth of less than 1 nm.

In some embodiments, assembling the photonic source further comprises optically coupling the laser array to an optical isolator configured to permit transmission of a plurality of optical beams emitted by the laser array.

In some embodiments, the optical isolator comprises a first magnet embedded in a first magnet retainer; a second magnet embedded in a second magnet retainer; and a mount joining the first magnet retainer with the second magnet retainer.

In some embodiments, the optical isolator further comprises an angled half-wave plate disposed between the first magnet and the second magnet.

In some embodiments, the optical isolator further comprises a plate having a rare-earth iron garnet (RIG) film disposed between the first magnet and the second magnet.

In some embodiments, assembling the photonic source further comprises coupling a steering lens array comprising a plurality of monolithically co-integrated lenses between the laser array and the coupling lens array, wherein coupling the steering lens array comprises laterally offsetting the steering lens array relative to the coupling lens array.

In some embodiments, assembling the photonic source further comprises coupling the laser array to a collimating lens array comprising a plurality of monolithically co-integrated lenses, wherein the lenses of the collimating lens array are configured to collimate optical beams emitted by the laser array.

In some embodiments, at least some of the monolithically co-integrated lasers are vertically offset relative to one another thereby defining a vertical extension, and the collimating lens array defines a mid-array axis with respect to a vertical direction, and wherein coupling the laser array to the collimating lens array comprises positioning the mid-array axis within the vertical extension with respect to the vertical direction.

In some embodiments, assembling the optical source further comprises obtaining a housing frame defining a first cavity, a second cavity and an enclosed window between the first cavity and the second cavity, and positioning the laser array within the first cavity and positioning the coupling lens array within the second cavity.

In some embodiments, assembling the optical source further comprises mounting a water-cooled heat sink to be thermally coupled to the laser array.

Some embodiments relate to a method for operating a computer, comprising controlling a photonic source to provide light to a photonic accelerator, wherein controlling the photonic source comprises: controlling a laser array comprising a plurality of monolithically co-integrated lasers to emit a plurality of optical beams; and coupling the optical beams to a fiber array through a coupling lens array comprising a plurality of monolithically co-integrated lenses; and controlling the photonic accelerator to perform matrix multiplication using the light.

In some embodiments, controlling the laser array to emit the plurality of optical beams comprises controlling laser array to emit between 0.1 W and 10 W of optical power.

In some embodiments, controlling the photonic source further comprises coupling the optical beams to the coupling lens array through a steering lens array comprising a plurality of monolithically co-integrated lenses, wherein the steering lens array is laterally offset relative to the coupling lens array.

In some embodiments, controlling the photonic source further comprises collimating the optical beams using a collimating lens array comprising a plurality of monolithically co-integrated lenses.

In some embodiments, controlling the photonic source further comprises isolating the collimated optical beams using an optical isolator.

In some embodiments, controlling the photonic source further comprises passing the optical beams through an enclosed window defined in a housing frame, wherein the housing frame further defines a first cavity and a second cavity, wherein the laser array is disposed within the first cavity and the coupling lens array is disposed within the second cavity.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in the figures in which they appear.

DETAILED DESCRIPTION

I. Overview

Figure 1A:
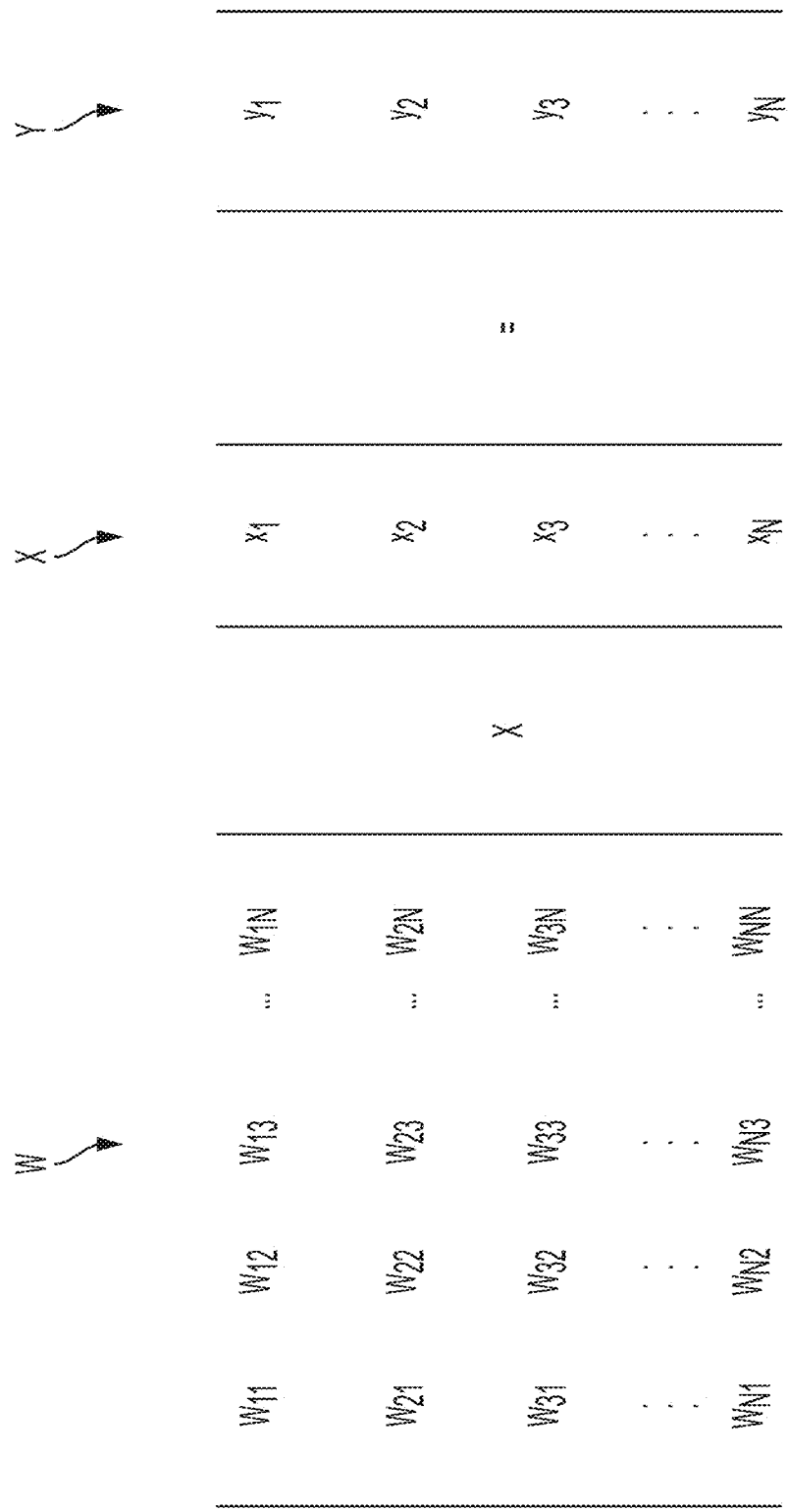
FIG. 1A illustrates a representative matrix-vector multiplication, in accordance with some embodiments.

The inventors have developed photonic sources and related systems that can satisfy the optical power requirements of large photonic accelerators. Photonic accelerators are circuits that can perform different types of operations (e.g., multiplications and additions, among others) using light. Photonic accelerators can be designed to run sophisticated machine learning algorithms or other types of data-intensive computations. For example, photonic accelerators can be designed to perform the types of linear operations involved in running machine learning algorithms. Certain machine learning algorithms, in fact, rely heavily on linear transformations on multi-dimensional arrays/tensors. Examples of these algorithms include support vector machines, artificial neural networks, and probabilistic graphical model learning. Performing linear operations in the optical domain (using light) presents several benefits over performing linear operations exclusively in the electrical domain. First, photonic accelerators have higher bandwidths than conventional electronic processors. Every wire and transistor in the circuits of an electronic processor has an intrinsic resistance, inductance, and capacitance that cause propagation delay and power dissipation in any electrical signal. For example, connecting multiple processor cores and/or connecting a processor core to a memory uses conductive traces having non-zero impedance. Large values of impedance limit the maximum rate at which data can be transferred through the trace with a negligible bit error rate. In applications where time delay is crucial, such as high frequency stock trading, even a delay of a few hundredths of a second can make an algorithm unfeasible. By contrast, optical signals travel at the speed of light; thus, the latency of photonic signals is far less of a limitation than electrical propagation delay. Second, virtually no electrical power is dissipated as light signals travel across a photonic accelerator. Vice versa, power dissipation is a severe bottleneck in conventional electronic processors. Third, the analog nature of photonic accelerators makes them more suitable than digital implementations to perform linear transformations such as matrix multiplication.

Notwithstanding the benefits listed above, use of photonic accelerators in data-intensive computations present a major challenge: the optical power required to handle data sets using photonic accelerators is relatively large, in some embodiments in excess of 2 W or 3 W. Providing such large optical power levels require powerful optical sources. Unfortunately, implementing powerful optical sources on chip is quite challenging.

Some photonic accelerators of the types described herein are implemented using silicon photonics. Silicon photonics is a technology that allows fabrication of photonic components (e.g., waveguides, modulators, couplers, etc.) using well established silicon-based fabrication facilities and processes, including complementary metal-oxide-semiconductor (CMOS) processes. Use of silicon-based fabrication processes allows manufacturing in large volumes in a way that would not be possible using other semiconductor processes. The major drawback of silicon photonics is the inability to produce reliable silicon-based photonic sources. Silicon is a poor light emitter due to its nature as an indirect bandgap semiconductor. This means than photon emission can occur only when assisted by a phonon transaction (emission or absorption), which results in very low light emission rates. Although several attempts have been made to integrate photonic sources on silicon chips, the need for reliable silicon-based photonic sources remains largely unmet.

Recognizing that co-integrating a photonic source and a silicon-based photonic accelerator on the same chip is impractical, the inventors have developed external photonic sources that can be coupled to photonic accelerators using fiber optic transmission. Use of fiber optic transmission, however, presents its own challenges. When presented with large optical power densities, an optical fiber exhibits a variety of undesired effects that negatively affect the integrity of the optical signals that travel through it. For example, optical fibers undergo certain types of non-linear optical effects. Above a power density threshold, these non-linear optical effects can result in an optical modulation of the refractive index of the fiber core, resulting in undesired signal distortions. Additionally, large power densities can result in highly localized hot spots of large temperature, which can also result in local modulation of the refractive index of the fiber core, or even worse, in permanent damage of the fiber core. Unfortunately, with the large power levels involved in photonic accelerator, large power densities are inevitable.

The inventors have recognized and appreciated that the negative effects resulting from large power densities can be circumvented by distributing the required optical power across several optical fibers. Accordingly, some embodiments use fiber arrays to couple a photonic source to a photonic accelerator. In this way, each optical fiber can be presented with a lower power density that would otherwise be necessary to deliver the desired power using a single optical fiber, thereby reducing the impact of non-linear effects and localized hot spots.

The inventors have further recognized that designing compact, semiconductor-based light emitters that can emit the power levels required by photonic accelerators and that can produce silicon-compatible wavelengths (wavelengths to which silicon is transparent) is challenging. Several factors limit the largest power that a semiconductor-based light emitter can emit. One of these factors is the decrease in gain due to self-heating under continuous wave (CW) operation. The inventors propose overcoming the optical power limitations of photonic sources by combining the outputs of multiple photonic sources together, for example using laser arrays. Accordingly, some embodiments rely on laser arrays and fiber arrays to convey large optical power levels to photonic accelerators.

Unfortunately, using a laser array in connection with a fiber array presents a challenge that does not exist in single-laser/single-fiber systems. Optically aligning one laser to one fiber is a relatively straightforward proposition. However, optically aligning individual lasers to corresponding fibers all at the same time becomes impractical, especially with sub-millimeter precision. Delivering the power levels necessary to sustain the operation of a photonic accelerometer requires that the lasers of an array be tightly packed, otherwise the overall size of the fiber array would be too large to fit on a chip. For example, in some embodiments, the separation between adjacent lasers is less than 1 mm. Individually aligning lasers to fibers with sub-millimeter precision is impractical because the pick-and-place mechanisms used to control the position and orientation of optical components require significantly more than 1 mm of space.

The inventors have recognized and appreciated an architectures that enables simultaneous optical alignment between multiple laser/fiber pairs. The architectures developed by the inventors rely on monolithically co-integrated optical arrays. Some embodiments, for example, rely on laser arrays including multiple monolithically co-integrated lasers and lens arrays including multiple monolithically co-integrated lenses. The co-integrated nature of these components facilitates the optical alignment with sub-millimeter precision. On-chip lasers can be patterned using lithographic techniques, which enable spatial resolutions as small as a few microns. Accordingly, photolithography enables fabrication of laser arrays in which the separation between adjacent lasers is less than 1 mm. Further, monolithically co-integrated optical components enable optical alignment to be performed at the chip level, rather than at the individual component level. Thus, optically aligning a laser array to a lens array involves a single alignment step, as opposed to several alignment steps that would otherwise be required to individually align each laser to a corresponding lens.

II. Photonic Accelerators

Aspects of the present application relate to analog accelerators configured to execute machine learning algorithms, including neural networks. Accelerators are microprocessors that are capable of accelerating certain types of workloads. Typically, workloads that can be accelerated are offloaded to high-performance accelerators, which are much more efficient at performing workloads such as artificial intelligence, machine vision, and deep learning. Accelerators are specific purpose processors and are often programmed to work in conjunction with general purpose processors to perform a task. Analog accelerators are accelerators that perform computations in the analog domain.

Photonic accelerators are a particular class of analog accelerators in which computations are performed in the optical domain (using light). The inventors have recognized and appreciated that using optical signals (instead of, or in combination with, electrical signals) overcomes some of the problems with electronic computing, as described above.

Some embodiments relate to photonic accelerators designed to run machine learning algorithms or other types of data-intensive computations. Certain machine learning algorithms (e.g., support vector machines, artificial neural networks and probabilistic graphical model learning) rely heavily on linear transformations on multi-dimensional arrays/tensors. The simplest linear transformation is a matrix-vector multiplication, which using conventional algorithms has a complexity on the order of $O(N^2)$, where N is the dimensionality of a square matrix being multiplied by a vector of the same dimension. General matrix-matrix (GEMM) operations are ubiquitous in software algorithms, including those for graphics processing, artificial intelligence, neural networks and deep learning.

FIG. 1A is a representation of a matrix-vector multiplication, in accordance with some embodiments. Matrix-vector multiplication is an example of GEMM. Matrix W is referred to herein as "weight matrix," "input matrix" or simply "matrix," and the individual elements of matrix W are referred to herein as "weights," "matrix values" or "matrix parameters." Vector X is referred to herein as "input vector," and the individual elements of vector X are referred to as "input values," or simply "inputs." Vector Y is referred to herein as "output vector," and the individual elements of vector Y are referred to as "output values," or simply "outputs." In this example, W is an N×N matrix, though embodiments of the present application are not limited to square matrices or to any specific dimension. In the context of artificial neural networks, matrix W can be a weight matrix, or a block of submatrix of the weight tensor, or an activation (batched) matrix, or a block of submatrix of the (batched) activation tensor, among several possible examples. Similarly, the input vector X can be a vector of the weight tensor or a vector of the activation tensor, for example.

The matrix-vector multiplication of FIG. 1A can be decomposed in terms of scalar multiplications and scalar additions. For example, an output value $y_i$ (where i=1, 2 . . . N) can be computed as a linear combination of the input values $x_1, x_2 \ldots x_N$. Obtaining $y_i$ involves performing scalar multiplications (e.g., $W_{i1}$ times $x_1$, and $W_{i2}$ times $x_2$) and scalar additions (e.g., $W_{i1}x_1$ plus $W_{i2}x_2$). In some embodiments, scalar multiplications, scalar additions, or both, may be performed in the optical domain.

Figure 1B:
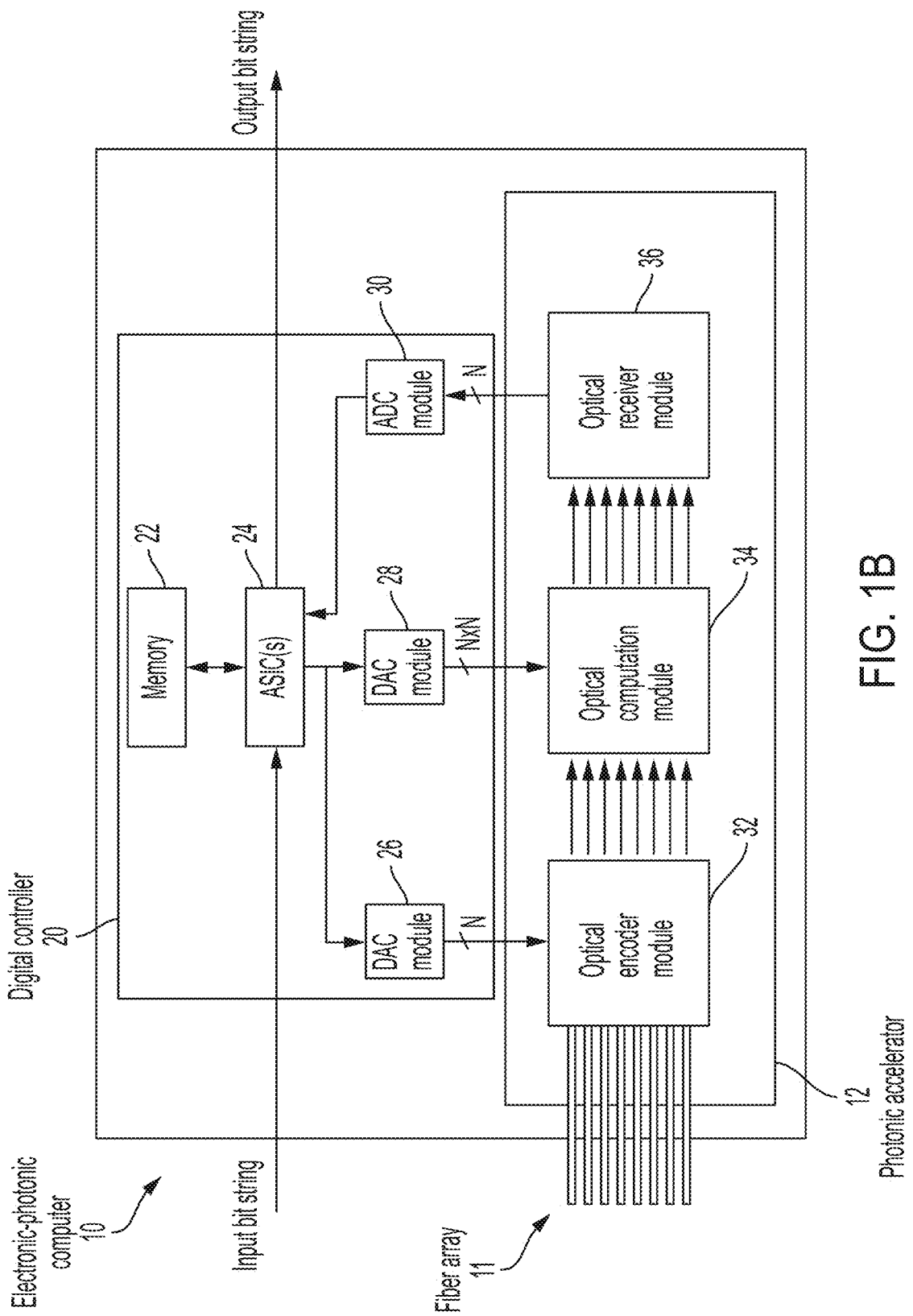
FIG. 1B is a block diagram illustrating an electronic-photonic computer configured to perform matrix multiplication, in accordance with some embodiments.

In some embodiments, the dimension of matrix W may be several hundreds or even several thousands, thus requiring large photonic accelerators to handle the large volume of multiplications and additions. FIG. 1B illustrates an electronic-photonic computer 10 implemented using photonic circuits, in accordance with some embodiments. Computer 10 may be configured to perform matrix multiplications (e.g., matrix-vector multiplications or matrix-matrix multiplications). Computer 10 includes a digital controller 20 and a photonic accelerator 12. Digital controller 20 operates in the digital domain and photonic accelerator 12 operates in the analog photonic domain.

Digital controller 20 includes one or more ASICs 24 and a memory 22. Photonic accelerator 12 includes an optical encoder module 32, an optical computation module 34 and an optical receiver module 36. Digital-to-analog (DAC) modules 26 and 28 convert digital data to analog signals. Analog-to-digital (ADC) module 30 converts analog signals to digital values. Thus, the DAC/ADC modules provide an interface between the digital domain and the analog domain. In this example, DAC module 26 produces N analog signals (one for each entry of an input vector), DAC module 28 produces N×N analog signals (one for each entry of a matrix), and ADC module 30 receives N analog signals (one for each entry of an output vector). Although matrix W is square in this example, it may be rectangular in some embodiments, such that the size of the output vector differs from the size of the input vector.

Computer 10 receives, as an input from an external processor (e.g., a CPU), an input vector represented by a group of input bit strings and produces an output vector represented by a group of output bit strings. For example, if the input vector is an N-dimensional vector, the input vector may be represented by N separate bit strings, each bit string representing a respective component of the vector. The input bit string may be received as an electrical signal from the external processor and the output bit string may be transmitted as an electrical signal to the external processor. In some embodiments, ASIC(s) 24 do not necessarily output an output bit string after every process iteration. Instead, ASIC(s) 24 may use one or more output bit strings to determine a new input bit stream to feed through the components of the computer 10. In some embodiments, the output bit string itself may be used as the input bit string for a subsequent iteration of the process implemented by the computer 10. In other embodiments, multiple output bit streams are combined in various ways to determine a subsequent input bit string. For example, one or more output bit strings may be summed together as part of the determination of the subsequent input bit string.

DAC module 26 is configured to convert digital data into analog signals. The optical encoder module 32 is configured to convert the analog signals into optically encoded information to be processed by the optical computation module 34. The information may be encoded in the amplitude, phase and/or frequency of an optical pulse. Accordingly, optical encoder module 32 may include optical amplitude modulators, optical phase modulators and/or optical frequency modulators. In some embodiments, the optical signal represents the value and sign of the associated bit string as an amplitude and a phase of an optical pulse. In some embodiments, the phase may be limited to a binary choice of either a zero phase shift or a π phase shift, representing a positive and negative value, respectively. Embodiments are not limited to real input vector values. Complex vector components may be represented by, for example, using more than two phase values when encoding the optical signal.

The optical encoder module 32 outputs N separate optical pulses that are transmitted to the optical computation module 34. Each output of the optical encoder module 32 is coupled one-to-one to an input of the optical computation module 34. In some embodiments, the optical encoder module 32 may be disposed on the same substrate as the optical computation module 34 (e.g., the optical encoder module 32 and the optical computation module 34 are on the same chip). In such embodiments, the optical signals may be transmitted from the optical encoder module 32 to the optical computation module 34 in waveguides, such as silicon photonic waveguides.

The optical computation module 34 performs the multiplication of an input vector X by a matrix W. In some embodiments, optical computation module 34 includes multiple optical multipliers each configured to perform a scalar multiplication between an entry of the input vector and an entry of matrix W in the optical domain. Optionally, optical computation module 34 may further include optical adders for adding the results of the scalar multiplications to one another in the optical domain. Alternatively, the additions may be performed electrically. For example, optical receiver module 36 may produce a voltage resulting from the integration (over time) of a photocurrent received from a photodetector.

The optical computation module 34 outputs N separate optical pulses that are transmitted to the optical receiver module 36. Each output of the optical computation module 34 is coupled one-to-one to an input of the optical receiver module 36. In some embodiments, the optical computation module 34 may be disposed on the same substrate as the optical receiver module 36 (e.g., the optical computation module 34 and the optical receiver module 36 are on the same chip). In such embodiments, the optical signals may be transmitted from the optical computation module 34 to the optical receiver module 36 in silicon photonic waveguides. In other embodiments, the optical computation module 34 may be disposed on a separate substrate from the optical receiver module 36. In such embodiments, the optical signals may be transmitted from the photonic computer 103 to the optical receiver module 36 using optical fibers.

The optical receiver module 36 receives the N optical pulses from the optical computation module 34. Each of the optical pulses is then converted to an electrical analog signal. In some embodiments, the intensity and phase of each of the optical pulses is detected by optical detectors within the optical receiver module. The electrical signals representing those measured values are then converted into the digital domain using ADC module 30, and provided back to ASIC(s) 24.

ASIC(s) 24 control the optical encoder module 32, the optical computation module 34 and the optical receiver module 36. The memory 22 may be used to store input and output bit strings and measurement results from the optical receiver module 36. The memory 22 also stores executable instructions that, when executed by ASIC(s) 24, control the optical encoder module 32, optical computation module 34 and optical receiver module 36. The memory 22 may also include executable instructions that cause ASIC(s) 24 to determine a new input vector to send to the optical encoder based on a collection of one or more output vectors determined by the measurement performed by the optical receiver module 36. In this way, ASIC(s) 24 can control an iterative process by which an input vector is multiplied by multiple matrices by adjusting the settings of the optical computation module 34 and feeding detection information from the optical receiver module 36 back to the optical encoder module 32. Thus, the output vector transmitted by the computer 10 to the external processor may be the result of multiple matrix-matrix multiplications, not simply a single matrix-matrix multiplication.

As indicated above, the dimension of matrix W may be several hundreds if not several thousands in some embodiments, thus requiring sufficiently large photonic accelerators to handle the computations. For example, a photonic accelerator configured to handle 1024×1024 matrices may include more than one million photonic multipliers. The large number of photonic components needed to perform matrix multiplication over large data sets require large optical power to operate. For example, a photonic accelerator may require between 0.1 W and 10 W of optical power, between 1 W and 10 W, between 1 W and 5 W, between 2 W and 10 W, between 2 W and 5 W, or between 2 W and 4 W.

As discussed in detail further below, photonic accelerator 12 receives light through fiber array 11. The light is eventually encoded as described above using optical encoder module 32. It should be noted that the fiber array 11 may have a number of fibers different from N in some embodiments, as there is no requirement that the number of fibers matches the dimension of matrix W.

III. Photonic Sources

Figure 1C:
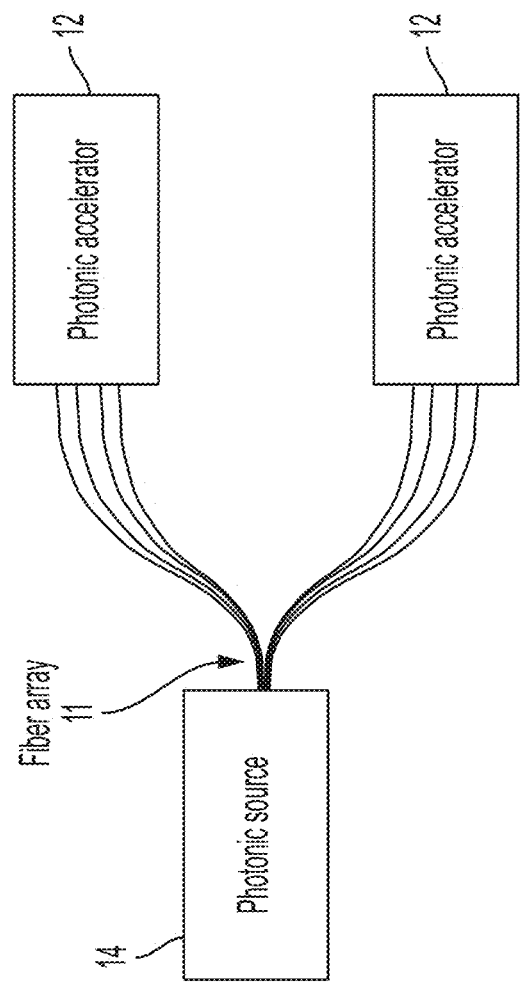
FIG. 1C is a block diagram of a system including a photonic source coupled to photonic accelerators via a fiber array, in accordance with some embodiments.

FIG. 1C is a block diagram illustrating a system in which a photonic source 14 provides optical power to a pair of photonic accelerators 12 via fiber array 11. It should be noted that architectures of the types described herein may involve different number of photonic sources and different numbers of photonic accelerators from what is shown in FIG. 1C, as embodiments of the present application are not limited in this respect. Photonic source 14 may emit light at wavelengths that are silicon-compatible (wavelengths to which silicon is transparent) so that the light can travel through the circuits of the photonic accelerator without incurring optical loss. For example, photonic source 14 may emit light in the 1300-1320 nm range, or in the 1500-1600 nm range, to name a few examples. Further, photonic source 14 may emit light with sufficient optical power to allow the photonic accelerator(s) to perform their computations. As discussed above, these computations may require substantial optical power levels, especially for photonic accelerator handling large data sets. In some embodiments, photonic source 14 may emit between 0.1 W and 10 W of optical power, between 1 W and 10 W, between 1 W and 5 W, between 2 W and 10 W, between 2 W and 5 W, between 2 W and 4 W, or any range within these ranges. Other ranges are also possible.

Thus, the photonic sources described herein can satisfy the large optical power requirement of photonic accelerators. The photonic sources developed by the inventors enable simultaneous optical alignment between multiple laser/fiber pairs with sub-millimeter precision. The architectures developed by the inventors rely on monolithically co-integrated optical arrays. Some embodiments, for example, rely on laser arrays including multiple monolithically co-integrated lasers and lens arrays including multiple monolithically co-integrated lenses. The co-integrated nature of these components facilitates the optical alignment. Optically aligning a laser array to a lens array involves a single alignment step, as opposed to several alignment steps that would otherwise be required to individually align each laser to a corresponding lens.

Figure 2:
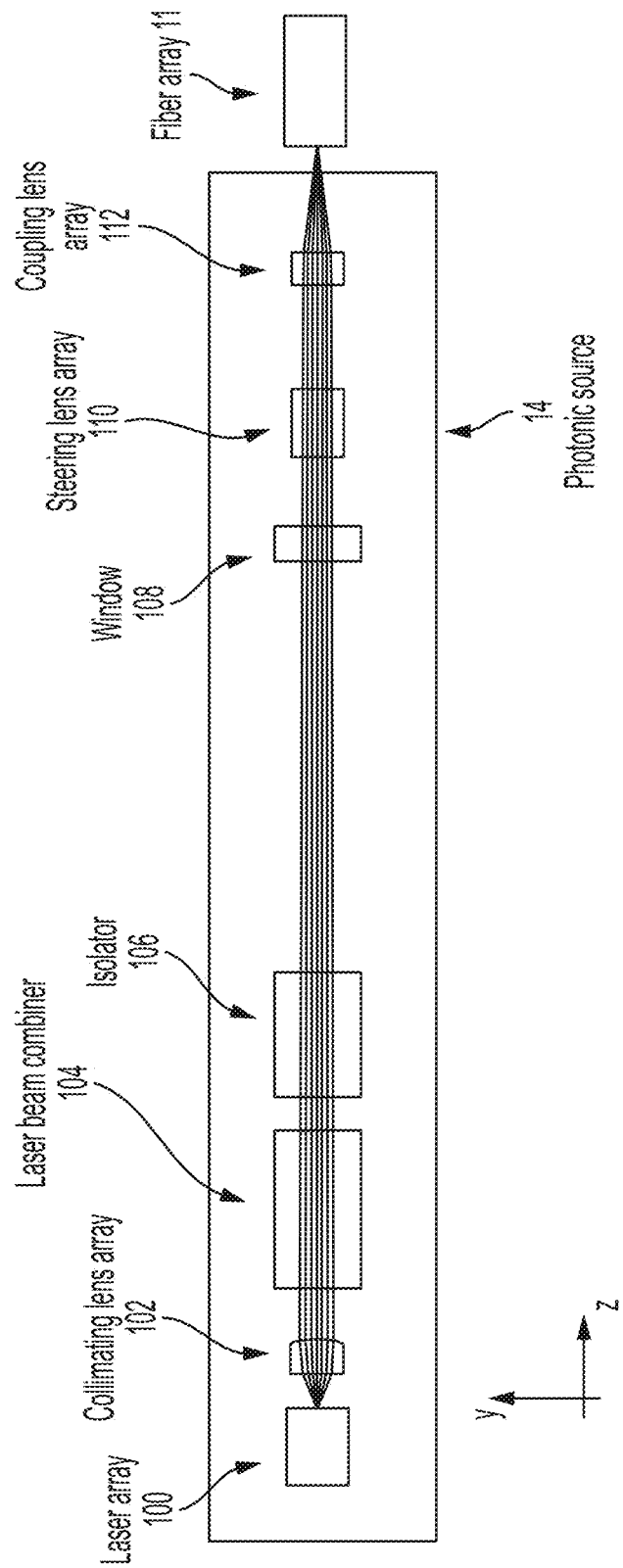
FIG. 2 is a block diagram of a photonic source, in accordance with some embodiments.

FIG. 2 is a block diagram of a photonic source 14, in accordance with some embodiments. In particular, FIG. 2 illustrates the optical path from optical generation to coupling to fiber array 11. Photonic source 14 includes a laser array 100, a collimating array 102, a laser beam combiner 104, an optical isolator 106, a window 108, a steering lens array 110 and a coupling lens array 112. It should be noted that not all embodiments need to include all the components of FIG. 2. For example, some embodiments may omit collimating lens array 102 and/or laser beam combiner 104 and/or isolator 106 and/or window 108 and/or steering lens array 110.

Laser array 100 includes multiple lasers emitting in a common wavelength range. Each laser may emit optical power in the hundreds of milliwatts. In one example, laser array 100 includes 19 lasers, each emitting 200 mW of optical power. As a result, laser array emits 3.8 W.

Collimating lens array 102 includes multiple lenses arranged to collimate the optical beams emitted by the lasers. Upon collimation, the optical beams travel substantially parallel to one another along the optical propagation axis (parallel to the z-axis). This facilitates optical coupling to subsequent components. Laser beam combiner 104 may lock the optical beams emitted by the lasers together to produce more power at the target wavelength. In some embodiments, laser beam combiner 104 is implemented using a dispersive element, such as a volume Bragg grating (VBG), examples of which are described in detail further below. Optical isolator 106 may be designed to permit transmission of light in one direction (from the lasers to the fibers) and to block transmission of light in the opposite direction (from the fibers to the lasers). Providing isolation allows the photonic source to safeguard the lasers against stray light, which may otherwise enter the laser cavities and disrupt the operation of the lasers.

Window 108 may be present in some embodiments, and may be a window defined through the housing frame hosting the components of photonic source 14. Coupling lens array 112 includes multiple lenses arranged to focus the optical beams to respective fibers of array 11. As discussed in detail further below, lateral misalignments of coupling lens array 112 with respect to the x-axis and/or the y-axis can negatively affect the array's ability to efficiently couple the beams to the fiber efficiently. This is because the coupling efficiency of the fibers is particularly susceptible to transverse misalignment. In some embodiments, the negative effects of transverse misalignments can be mitigated by introducing a steering lens array 110 in the optical path. Steering lens array 110 compensates for misalignment of coupling lens array 112 with respect to the optical propagation axis.

A. Monolithically Co-Integrated Photonic Components

Figure 3B:
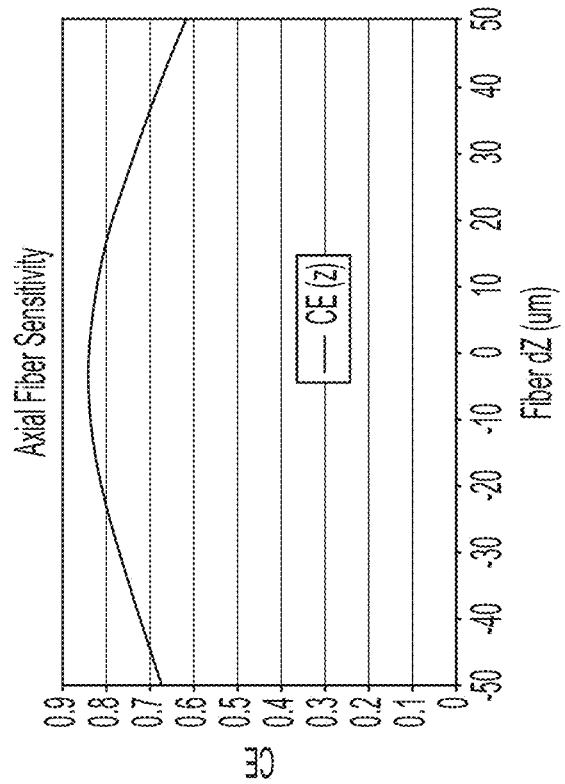
FIG. 3B is a plot illustrating the coupling efficiency of a fiber as a function of longitudinal misalignments, in accordance with some embodiments.
Figure 3A:
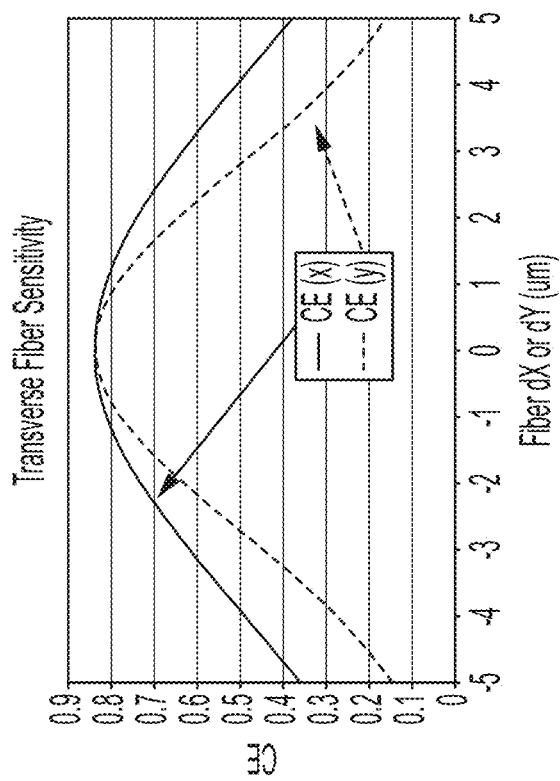
FIG. 3A is a plot illustrating the coupling efficiency of a fiber as a function of transverse misalignments, in accordance with some embodiments.

FIGS. 3A-3B illustrate the sensitivity of the coupling efficiency of a fiber to misalignments. In particular, FIG. 3A illustrates the coupling efficiency of a fiber plotted as a function of transverse misalignments (vertical misalignments along the x-axis and lateral misalignments along the y-axis, respectively). FIG. 3B illustrates the coupling efficiency of a fiber plotted as a function of longitudinal misalignments (along the z-axis) with respect to the focal plane of the incoming beam. As can be appreciated from these figures, the coupling efficiency of a fiber degrades significantly if the core of the fiber is misaligned with respect to the propagation axis of the optical beam. In this example, the coupling efficiency of the fiber is about 85% for perfect alignment, and drops to about 60% for a 2 µm-misalignment along the y-axis and to about 75% for a 2 µm-misalignment along the x-axis (the impact of longitudinal misalignments is less severe). As a result, properly aligning multiple optical beams from the lasers to respective fibers passing through one or more arrays of lenses and optionally, through a laser beam combiner, an isolator and a window, is a challenging proposition. The larger the number of lasers, the more challenging it is to properly align each and every beam.

In some embodiments, use of monolithically co-integrated optically component can overcome the challenges associated with aligning multiple beams, from the lasers to the fibers, all at the same time. Monolithically co-integrated optical components are such that the relative position of the co-integrated components is fixed and can be set as desired lithographically. The co-integrated nature of these components facilitates the optical alignment, as this can be performed at the chip level (involving one alignment step) rather than at the individual component level (involving multiple alignment steps), notwithstanding the sub-millimeter spacing between adjacent lasers. Thus, in some embodiments, the lasers of laser array are co-integrated with each other monolithically and the lenses of the lens arrays are also co-integrated with each other monolithically.

Figure 4B:
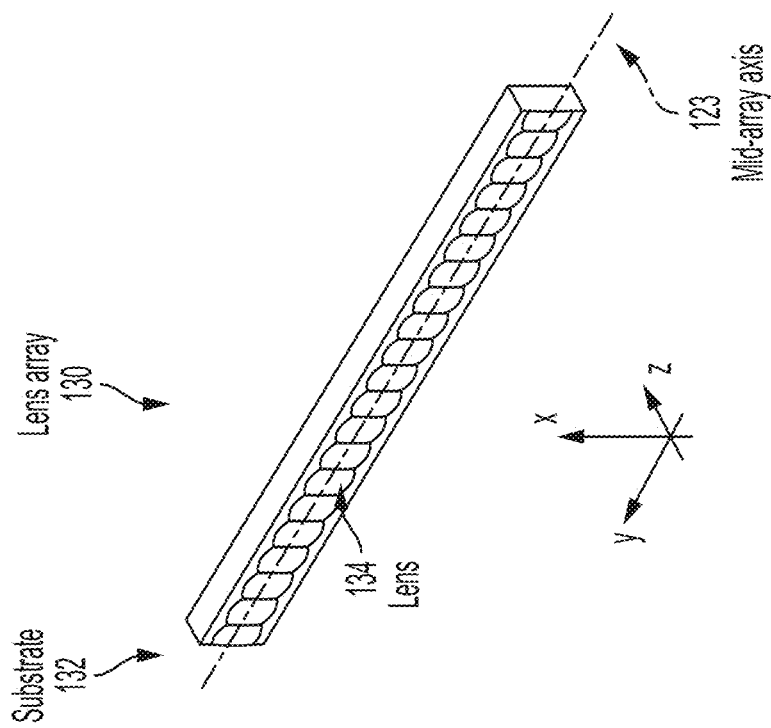
FIG. 4B is a schematic diagram of a lens array having a plurality of monolithically co-integrated lenses, in accordance with some embodiments.
Figure 4A:
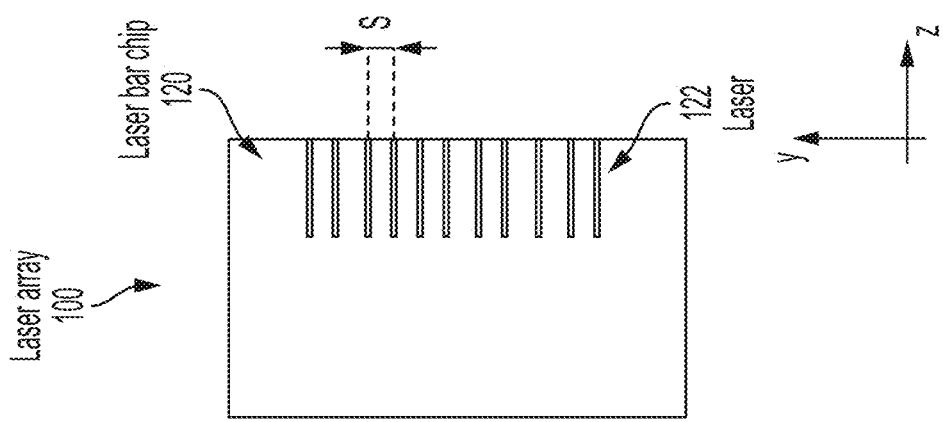
FIG. 4A is a schematic diagram of a laser array having a plurality of monolithically co-integrated lasers, in accordance with some embodiments.

FIG. 4A is a schematic diagram of a laser array having a plurality of monolithically co-integrated lasers, in accordance with some embodiments. Laser array 100 includes a laser bar chip 120 and multiple lasers 122 that are lithographically defined on chip 120. Chips 120 may be made of (or otherwise comprise) a semiconductor material, including for example InP, GaAs, AlGaAs, GaP, InAs, InGaP, GaN, InN, AN, and any suitable alloy thereof. Lasers 122 are preferably electrically pumped, although optically pumped lasers are also possible. The lasers may be driven to emit continuous wave (CW) light, although pulsed light is also an option. In this example, the lasers are edge emitting, although vertical emitting lasers are also an option. The optical power produced by each laser may be between 100 mW and 300 mW or between 100 mW and 500 mW, for example. In some embodiments, the separation ("S") between adjacent lasers is small, thus allowing the array to produce enough power using a relatively small footprint. For example, the separation between adjacent lasers may be between 0.1 mm and 0.9 mm, between 0.2 mm and 0.8 mm, or between 0.4 mm and 0.6 mm.

FIG. 4B is a schematic diagram of a lens array having a plurality of monolithically co-integrated lenses, in accordance with some embodiments. Lens array 130 includes a substrate 132, and multiple lenses 134 monolithically co-integrated in the substrate. In some embodiments, lenses 134 are defined lithographically, which allows accurate control of the location of the lenses. Any one (if not all) of the lens arrays of FIG. 2 may be implemented in accordance with the arrangement of FIG. 4B. Accordingly, FIG. 4B may represent the implementation of collimating lens array 102 and/or steering lens array 110 and/or coupling lens array 112. In some embodiments, implementing all the lens arrays of FIG. 2 in this way facilitates coupling from the lasers all the way through the fibers.

Figure 5A:
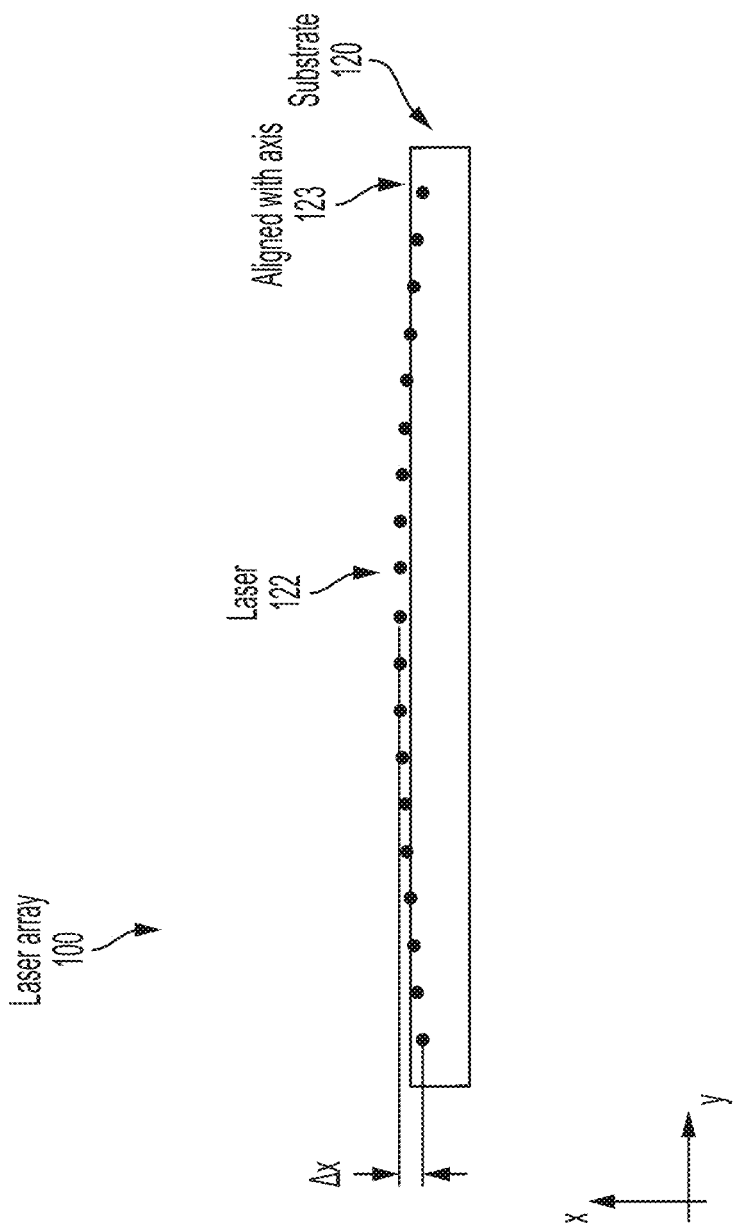
FIG. 5A is a schematic diagram of a laser array having lasers offset with respect to the vertical direction, in accordance with some embodiments.

The inventors have further appreciated that, in some embodiments, at least some of the lasers of FIG. 4A may inadvertently be offset along the vertical direction (the x-axis). This issue is illustrated in FIG. 5A. In this example, the vertical location of the lasers varies along the lateral direction in accordance with a downward facing parabola, although other shapes are also possible. This effect may be caused by the fact that the layer in which the lasers are defined has a different coefficient of thermal expansion (CTE) with respect to the CTE of the underlying substrate. As a result of the mismatched CTEs, stress may arise in the substrate. Substrate warping can result, thereby causing the vertical offset depicted in FIG. 5A. This effect can negatively impact the ability to align each laser to the subsequent lenses with respect to the vertical direction. In FIG. 5A, Δx indicates the vertical extension of the laser array.

In some embodiments, the negative effects of substrate warping can be obviated by positioning the subsequent lens arrays so that the mid-array axis falls within the vertical extension with respect to the vertical direction. Referring back to FIG. 4B, mid-array axis 123 indicates the axis that passes through the mid-point of the lenses with respect to the vertical direction. Referring again to FIG. 5A, the location of axis 123 along the vertical direction is such that it falls within vertical extension Δx. In some embodiments, axis 123 may be positioned to be vertically aligned to the lasers positioned approximately at ⅓ and ⅔ of the lateral extension (along the y-axis) of the laser array.

Figure 5B:
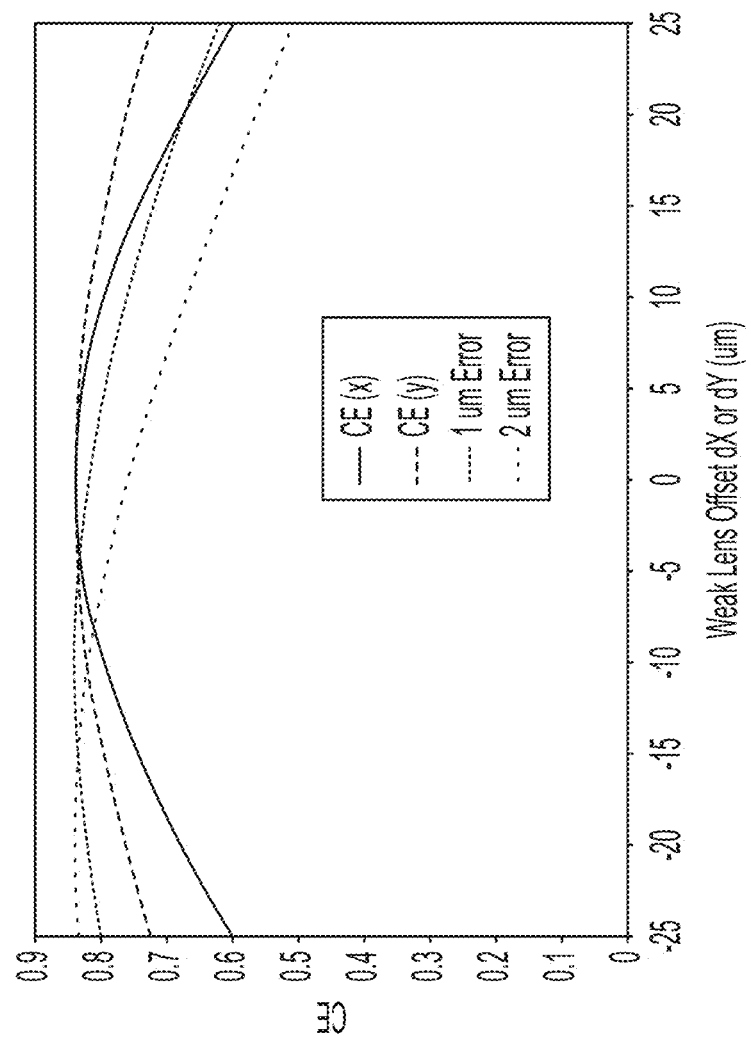
FIG. 5B is a plot illustrating the coupling efficiency of a lens as a function of transverse misalignments, in accordance with some embodiments.

In some embodiments, a steering lens array 110 may be introduced along the optical path leading to the fibers to compensate for transverse misalignments (vertical and/or lateral) of the coupling lens array 112 with respect to the propagation axes of the optical beams. FIG. 5B is a plot illustrating the sensitivity of the coupling coefficient of a lens of steering array 110 with respect to lateral and vertical misalignment. The top solid line represents the coupling efficiency vs. vertical misalignments, the bottom solid line represents the coupling efficiency vs. lateral misalignments. The dashed line represents the coupling coefficient for the case where a coupling lens has been misplaced by 1 μm in the lateral direction, and dotted line represents the coupling coefficient for the case where a coupling lens has been misplaced by 2 μm in the lateral direction. This plot illustrates that an error of 1 μm in the position of the coupling lens array can be compensated by a corresponding motion of 10 μm in the position of the steering lens array.

B. Laser Beam Combiner

Figure 6B:
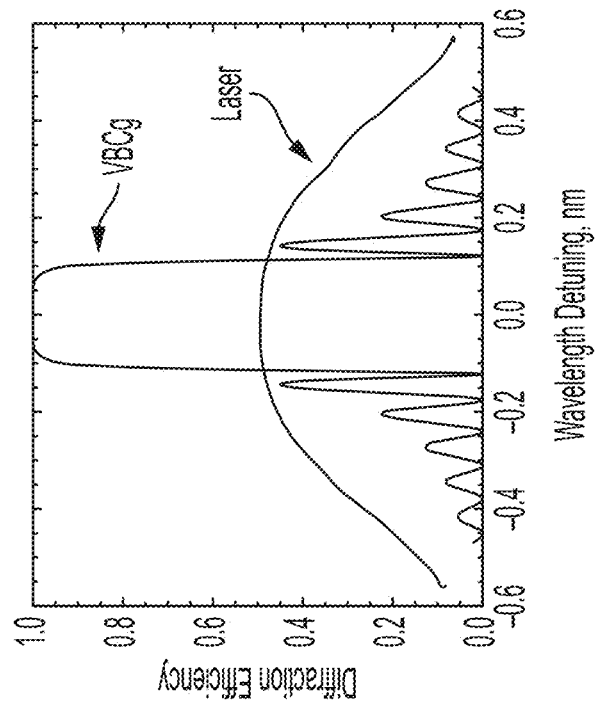
FIG. 6B is a plot illustrating an example spectral diffraction efficiency of a VBG, in accordance with some embodiments.
Figure 6A:
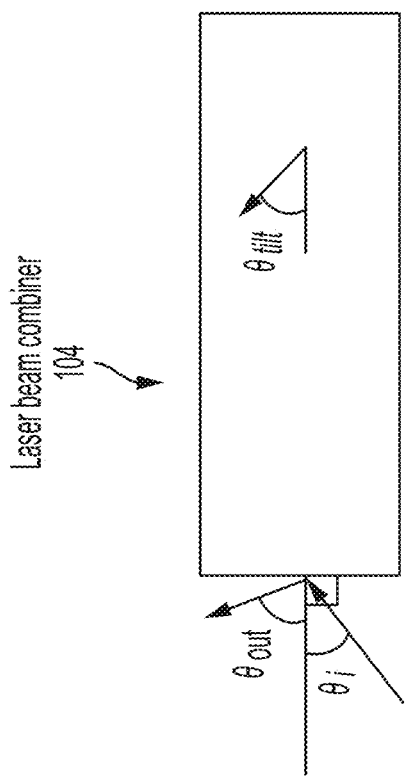
FIG. 6A is a schematic diagram of a volume Bragg grating (VBG), in accordance with some embodiments.

Laser beam combiner 104 may lock the optical beams emitted by the lasers together to produce more power at the target wavelength. In some embodiments, laser beam combiner 104 is implemented using a dispersive element, such as a volume Bragg grating (VBG). The VBG may be implemented as a transmission Bragg grating (TBG) or a reflection Bragg grating (RBG). For a TBG, incident light that satisfies the Bragg condition is transmitted. For an RBG, incident light that satisfies the Bragg condition is reflected. FIG. 6A depicts an example of an RBG, in accordance with some embodiments. Here, $\theta_i$ represents the angle of the incident light, $\theta_{out}$ represents the angle of the reflected light, and $\theta_{tilt}$ represents the angle of the periodic pattern defined inside the grating. FIG. 6B shows a possible frequency response of a VBG, in accordance with some embodiments. In particular, FIG. 6B illustrates the diffraction efficiency of a VBG with respect to wavelength detuning from the grating's center wavelength. The response exhibits a passband having a bandwidth of approximately 0.2 nm. It should be noted that that the bandwidth of the passband may be less than 10 nm in some embodiments, less than 5 nm in some embodiments, less than 2 nm in some embodiments, less than 1 nm in some embodiments, less than 0.8 nm in some embodiments, less than 0.6 nm in some embodiments, less than 0.4 nm in some embodiments, less than 0.2 nm in some embodiments, or less than 0.1 nm in some embodiments. For comparison, FIG. 6B further illustrates the emission spectrum of the laser array.

Figure 6D:
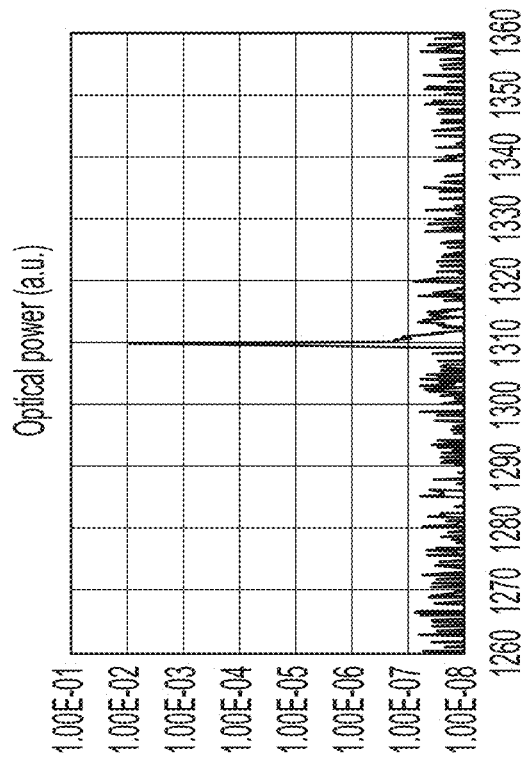
FIG. 6D is a plot illustrating the emission spectrum of a laser array upon transmission through a VBG, in accordance with some embodiments.
Figure 6C:
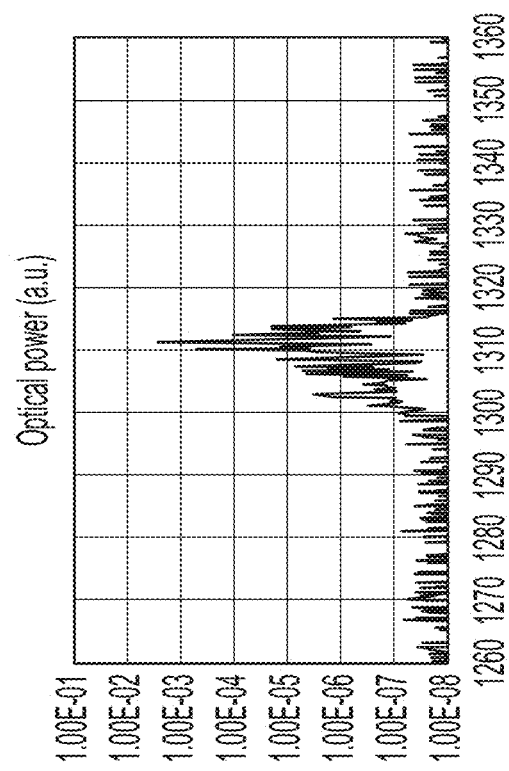
FIG. 6C is a plot illustrating the emission spectrum of a laser array before transmission through a VBG, in accordance with some embodiments.

The effect of the VBG can be appreciated from FIGS. 6C-6D, in accordance with some embodiments. FIG. 6C is a plot illustrating the emission spectrum of a laser array before transmission through a VBG. In this example, the emission spectrum is spread from about 1300 nm to about 1320 nm. The spread occurs because the emission wavelengths of the various lasers are not perfectly matched, for example due to variations resulting from the fabrication process. FIG. 6D is a plot illustrating the emission spectrum of a laser array upon transmission through a VBG. The VBG locks the emission spectrum of the laser array to within its passband, thereby substantially increasing the optical power at the wavelength of interest (1310 nm in this example).

C. Optical Isolator

Optical isolator 106 may be designed to permit transmission of light in one direction (from the lasers to the fibers) and to block transmission of light in the opposite direction (from the fibers to the lasers). Providing isolation allows the photonic source to safeguard the lasers against stray light, which may otherwise enter the laser cavities and disrupt the operation of the lasers.

Figure 7:
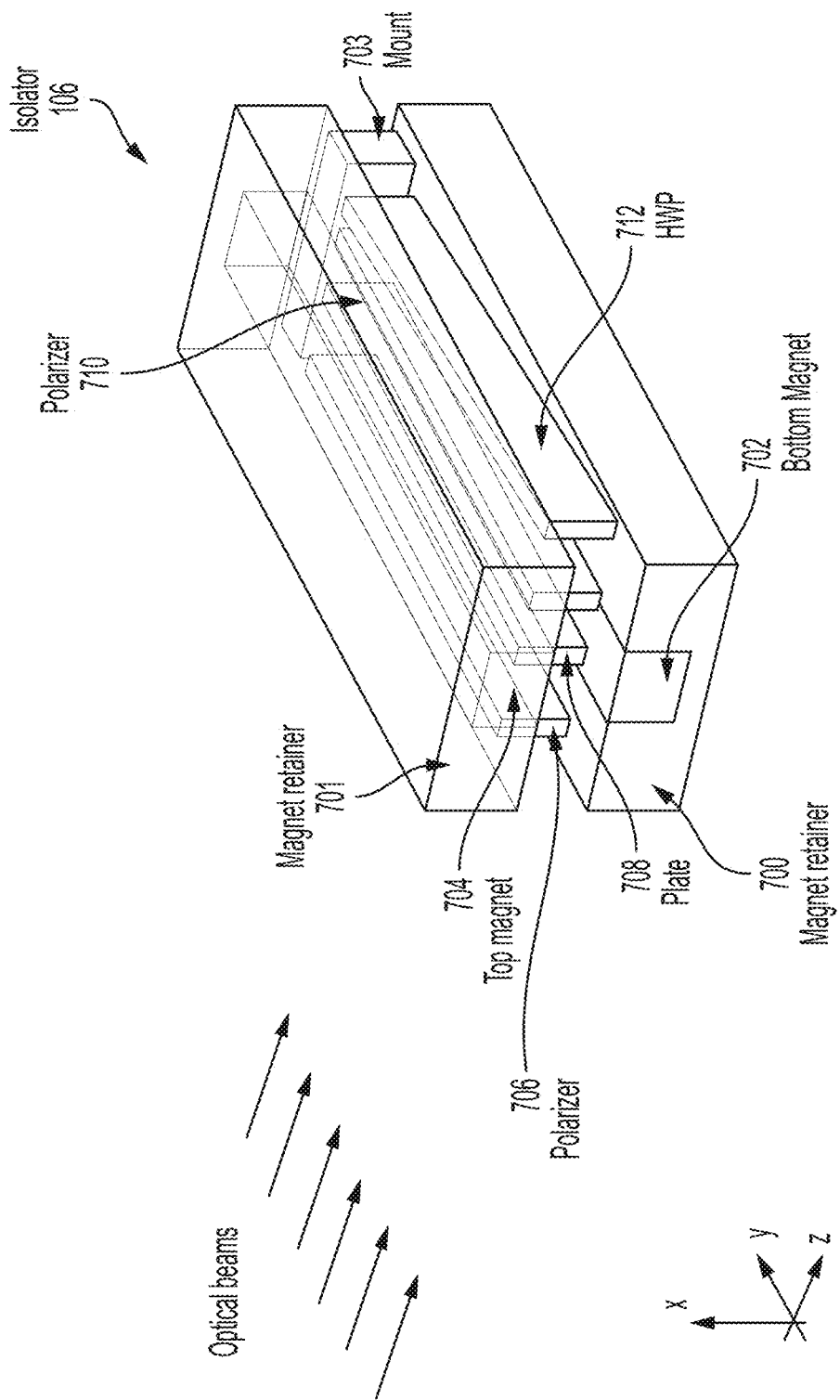
FIG. 7 is a schematic diagram of an optical isolator including a pair of magnets, in accordance with some embodiments.

An example implementation of optical isolator 106 is depicted in FIG. 7, in accordance with some embodiments. This isolator includes a bottom magnet 702 embedded in a magnet retainer 700 and a top magnet 704 embedded in a magnet retainer 701. The magnet retainers are joined together by mount 703. The magnet retainers and the mount allow the magnets to produce a magnetic field while fixing the position of the magnets. Otherwise, magnetic attraction/repulsion may result in vertical displacement of the magnets. Positioned between the magnets are polarizer 706, plate 708, polarizer 710 and half-wave plate (HWP) 712. In some embodiments, the isolator operates in accordance with the Faraday effect.

In one example, polarizers 706 and 710 present polarization axes angularly offset with respect to each other by 45 degrees. For example, polarizer 706 may be vertically polarized and polarizer 710 may be angled at 45 degrees relative to the vertical axis. Plate 708 may be configured as a Faraday rotator. When exposed to a magnetic field, plate 708 may rotate the polarization of light passing through it by 45 degrees. In some embodiments, plate 708 is implemented using an optically transmissive material coated with a rare-earth iron garnet (RIG). Light traveling in the forward direction becomes vertically polarized by polarizer 706.

Plate 708 rotates the polarization by 45 degrees. Polarizer 710 then enables the light to be transmitted through it. Light traveling in the backward direction becomes polarized at 45 degrees by polarizer 710. Plate 708 rotates the polarization by 45 degrees. This means the light becomes horizontally polarized. Because polarizer 706 is vertically polarized, backwardly-propagating light is blocked, thus providing the desired isolation.

HWP 712 rotates the polarization of the beams emerging from polarizer 710 to restore their original polarization. In some embodiments, HWP 712 may be angled with respect to the y-axis, as shown in FIG. 7, to prevent back reflections from travel back into the laser cavities.

The inventors have appreciated that sharing a single isolator among several lasers is beneficial over having one isolator for each individual laser. By sharing a common isolator, there is no need to individually align each optical beam to each isolator. Instead, the optical beams are aligned collectively, in a single step. Sharing a common isolator, however, presents a drawback: thermal lensing. Since the optical power density carried by each beam is very high (about 1 kW/cm$^2$ in some embodiments), this could lead to local heating of the optics, which could change the local optical properties (e.g., refractive index) of the optics. If the span of these local effects is larger than the pitch of the lasers, this could lead to cross-talk amongst neighboring lasers. In some embodiments, cross-talk may be obviated by providing sufficient separation between adjacent lasers. For example, in some embodiments, the separation between adjacent lasers may be no less than 0.1 mm.

IV. Packages

Figure 8A:
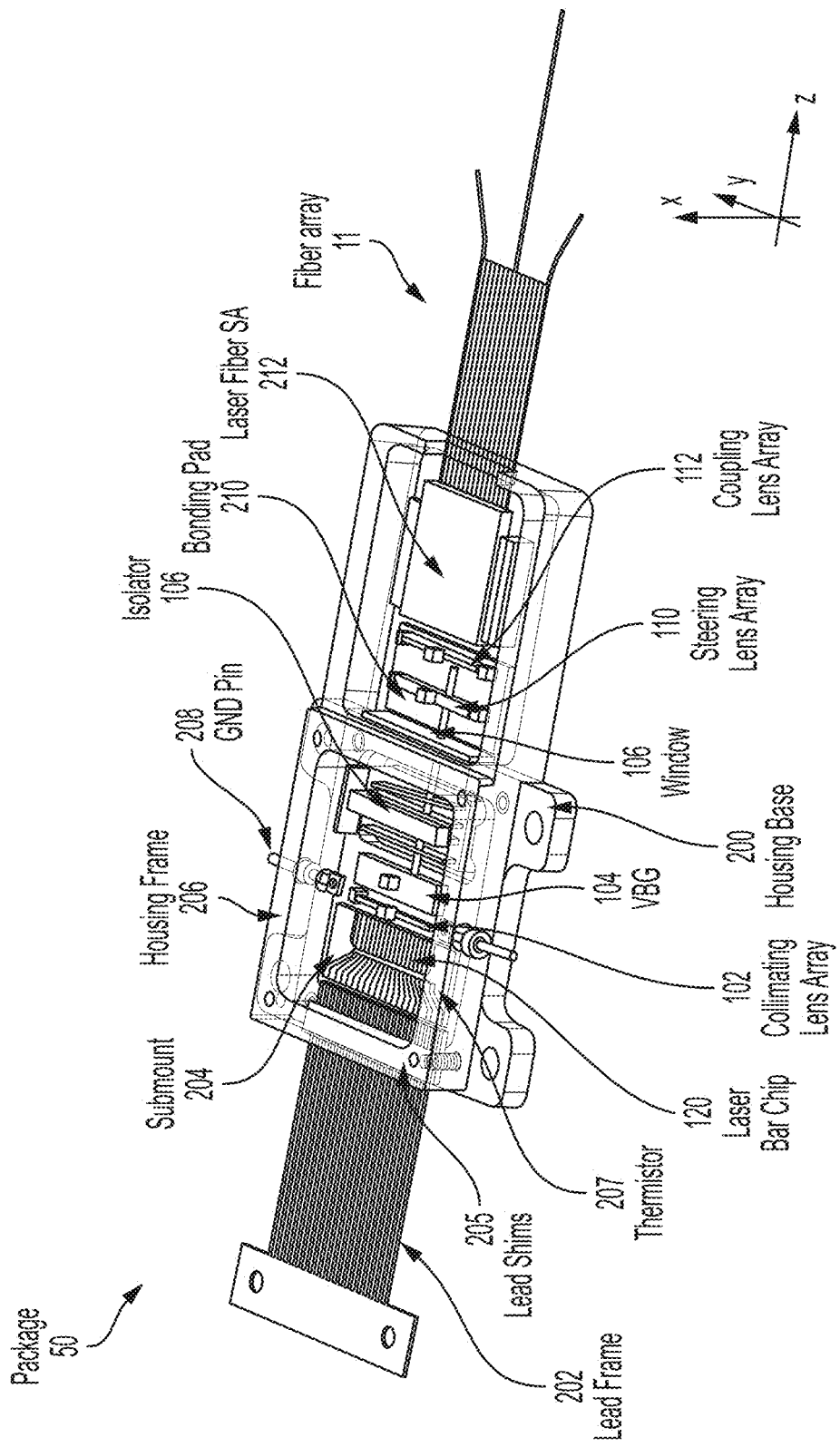
FIG. 8A is a perspective view of a package hosting a photonic source, in accordance with some embodiments.
Figure 8B:
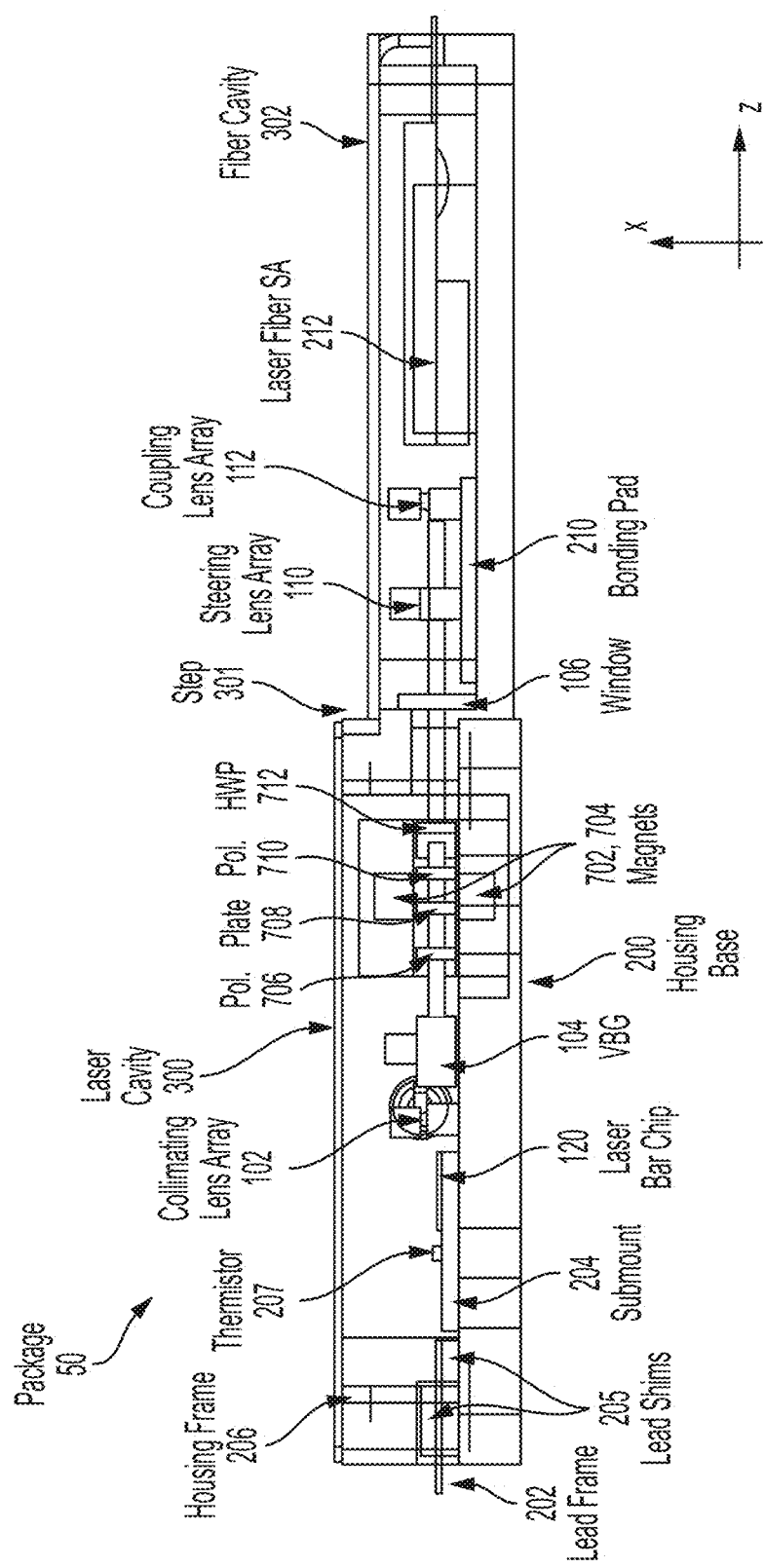
FIG. 8B is a side view of the package of FIG. 8A, in accordance with some embodiments.
Figure 8C:
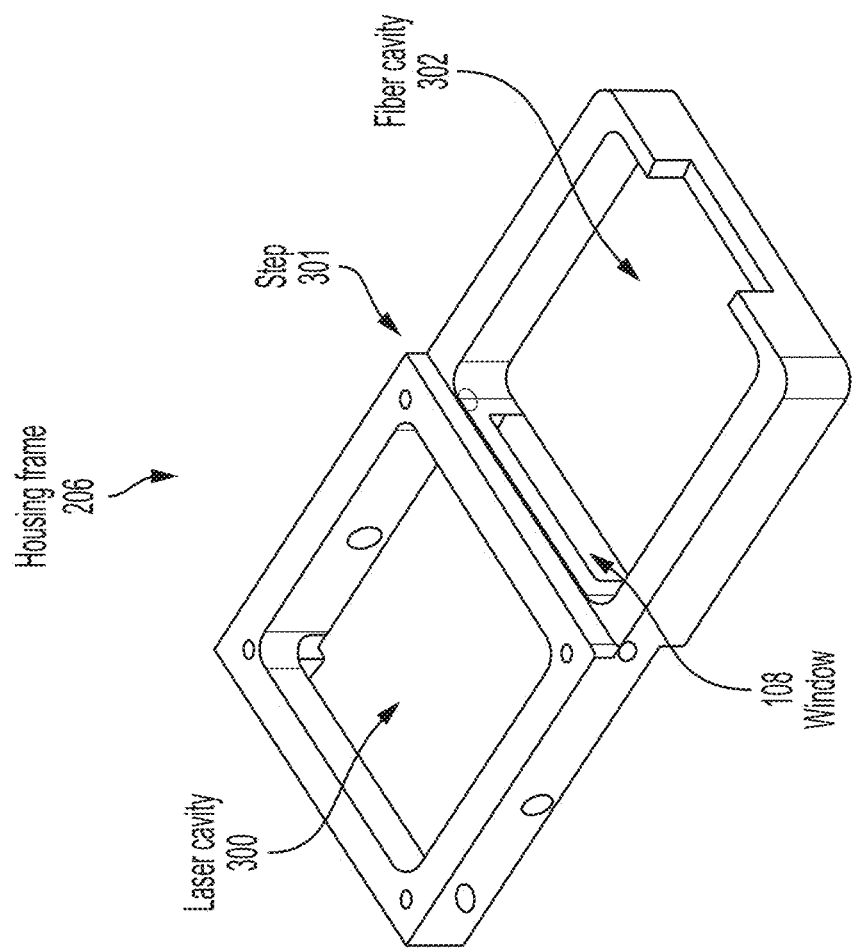
FIG. 8C is a perspective view of a housing frame used in the package of FIG. 8A, in accordance with some embodiments.

Some embodiments relate to assemblies for packaging photonic sources of the types described herein. FIGS. 8A-8C illustrate an example of a package 50, in accordance with some embodiments. FIG. 8A is a perspective view and FIG. 8B is a side view of the package, respectively. FIG. 8C is a perspective view of a housing frame 206.

Referring first to FIG. 8C, in some embodiments, housing frame 206 defines a laser cavity 300 and a fiber cavity 302. Laser cavity 300 hosts laser bar chip 120 and fiber cavity 302 hosts laser fiber sub-assembly (SA) 212, the assembly that holds the ends of the fibers of array 11 together. For example, laser fiber SA 212 may include an array of V-grooves for fixing the positions of the fibers in relationship with each other. In some embodiments, the laser cavity may further host the other components of the photonic source that require electrical power to operate. An enclosed window 108 separates the laser cavity from the fiber cavity. The window is sized and shaped to permit passage of the optical beams through it. In some embodiments, housing frame 206 further defines a step between the laser cavity and the fiber cavity. In some embodiments, the cavities may be vertically offset with respect to one another (from which step 301 results) to allow optical alignment between the components disposed in the laser cavity and the components disposed in the fiber cavity while also allowing the laser cavity to be raised. Raising laser cavity 300 provides sufficient space to accommodate bottom magnet 702 underneath the optical path (as shown in FIG. 8B), thereby avoiding disruption to the optical path through.

Defining the housing frame to have two separate cavities—one hosting laser bar chip 120 and one hosting laser fiber sub-assembly (SA) 212—may be advantageous in that it may facilitate hermetic sealing of the laser array. Using this arrangement, it is possible to hermetically seal the laser array (e.g., by filling the laser cavity with a sealant) without having to simultaneously seal the laser fiber sub-assembly (which is very challenging due to the presence of the fibers). The inventors have appreciated that hermetically sealing the laser array is more critical than hermetically sealing the laser fiber sub-assembly as the laser array is more susceptible to external agents (e.g., moisture, dust or other particles) than the laser fiber sub-assembly.

Referring now to FIGS. 8A-8B, the portion of the housing frame 206 that defines the laser cavity sits on a housing base 200. Housing base 200 further supports the collimating lens array 102, the VBG 104 and isolator 106. The bottom magnet 702 of the isolator is embedded in the housing base 200, thus allowing the bottom magnet to be positioned sufficiently low to avoid disrupting the optical path through the isolator. Laser bar chip 120 is mounted on a submount 204. Submount 204 further supports a thermistor 207, which sits next the laser bar chip 120. The thermistor may be used to monitor the temperature of the laser array. A ground (GND) pin 208 connects the package to ground. A lead frame 202 and lead shims 205 are connected to the rear side of housing base 200. Fiber cavity 302 hosts a bonding pad 210, on which sit steering lens array 110 and coupling lens array 112. Fiber cavity 302 further hosts laser fiber SA 212, to which the fibers of array 11 are attached.

The inventors have appreciated that the lasers described herein, being semiconductor-based, have relatively low quantum efficiencies. In some embodiments, for example, a laser may require approximately 1 W of electric power to emit 200 mW of optical power, resulting in a quantum efficiency of about 20%. This quantum efficiency is relatively low compared to other types of lasers. Consequently, a relatively large amount of electric power may be needed to produce the level of optical power required by a photonic accelerator. For example, at a 20% quantum efficiency, the photonic source may require 15 W to emit 3 W of optical power. Large electric power can lead to overheating, which can negatively affect the performance of the photonic source in numerous ways (e.g., by altering the threshold currents and/or the emission wavelengths of the lasers, or by permanently damaging the lasers). To reduce the risks associated with overheating, some embodiments employ water-cooled heat sinks.

Figure 9A:
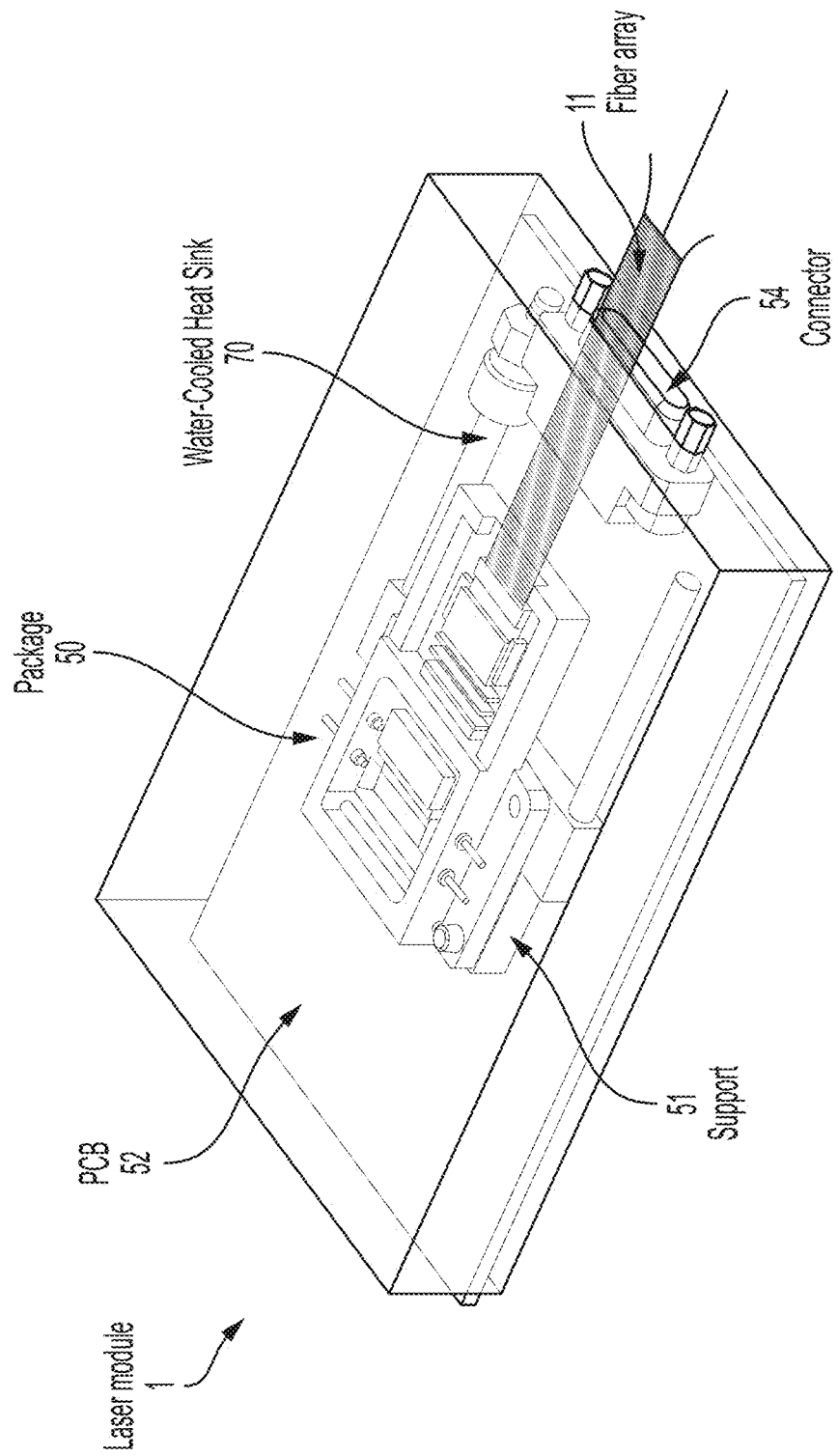
FIG. 9A is a perspective view of a laser module including a water-cooled photonic source, in accordance with some embodiments.

FIG. 9A is a schematic diagram of a laser module 1 including a package 50 and a water-cooled heat sink 70, in accordance with some embodiments. Package 50 (which includes a photonic source 14) sits on a support 51, which in turn sits on a printed circuit board (PCB) 52. Connector 54 allows electrical access to the electronic circuits (e.g., laser drivers) of the photonic source. Fiber array 11 is coupled to the photonic source as described in detail above. Water-cooled heat sink 70 includes a water pipe that wraps around the laser module. The water pipe passes underneath package 50, through support 51. In some embodiments, support 51 may operate as a cold plate. Water passing through the heat sink extracts heat from the package, thereby reducing the risk of overheating.

Figure 9B:
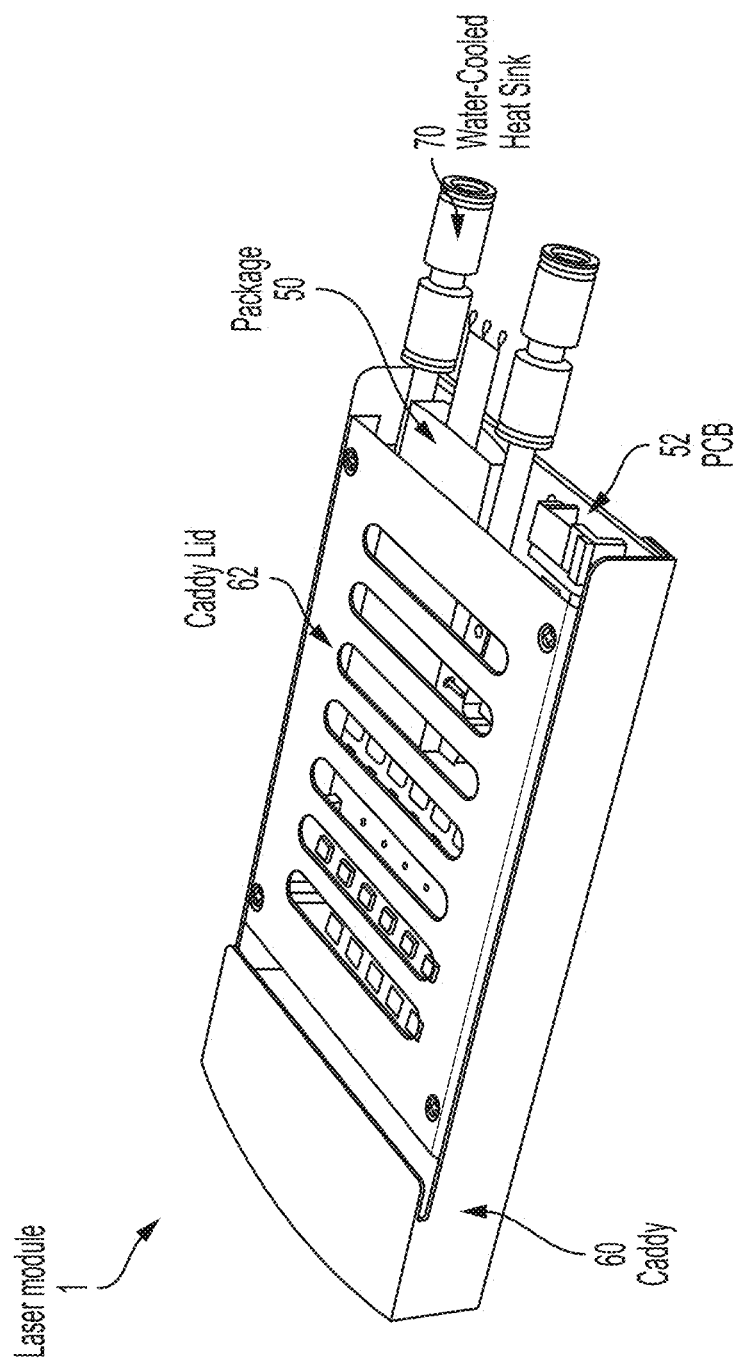
FIG. 9B is a perspective view of the laser module of FIG. 9A when embedded in a caddy, in accordance with some embodiments.

FIG. 9B is another schematic diagram of laser module 1. In this depiction, the laser module is enclosed within a caddy 60 and a caddy lid 62. Caddy 60 may be for example a 2.5" SATA caddy. Accordingly, the laser source 14 may be sized to fit within the footprint of a 2.5" SATA caddy. The caddy lid protects the top side of the laser module.

V. Electronic-Photonic Servers

The techniques, devices and methods described herein may be used to produce electronic-photonic computers, including electronic-photonic servers. Such servers may be used in a variety of applications, including in deep learning algorithms, high-frequency trading, weather forecasting, etc.

Figure 10A:
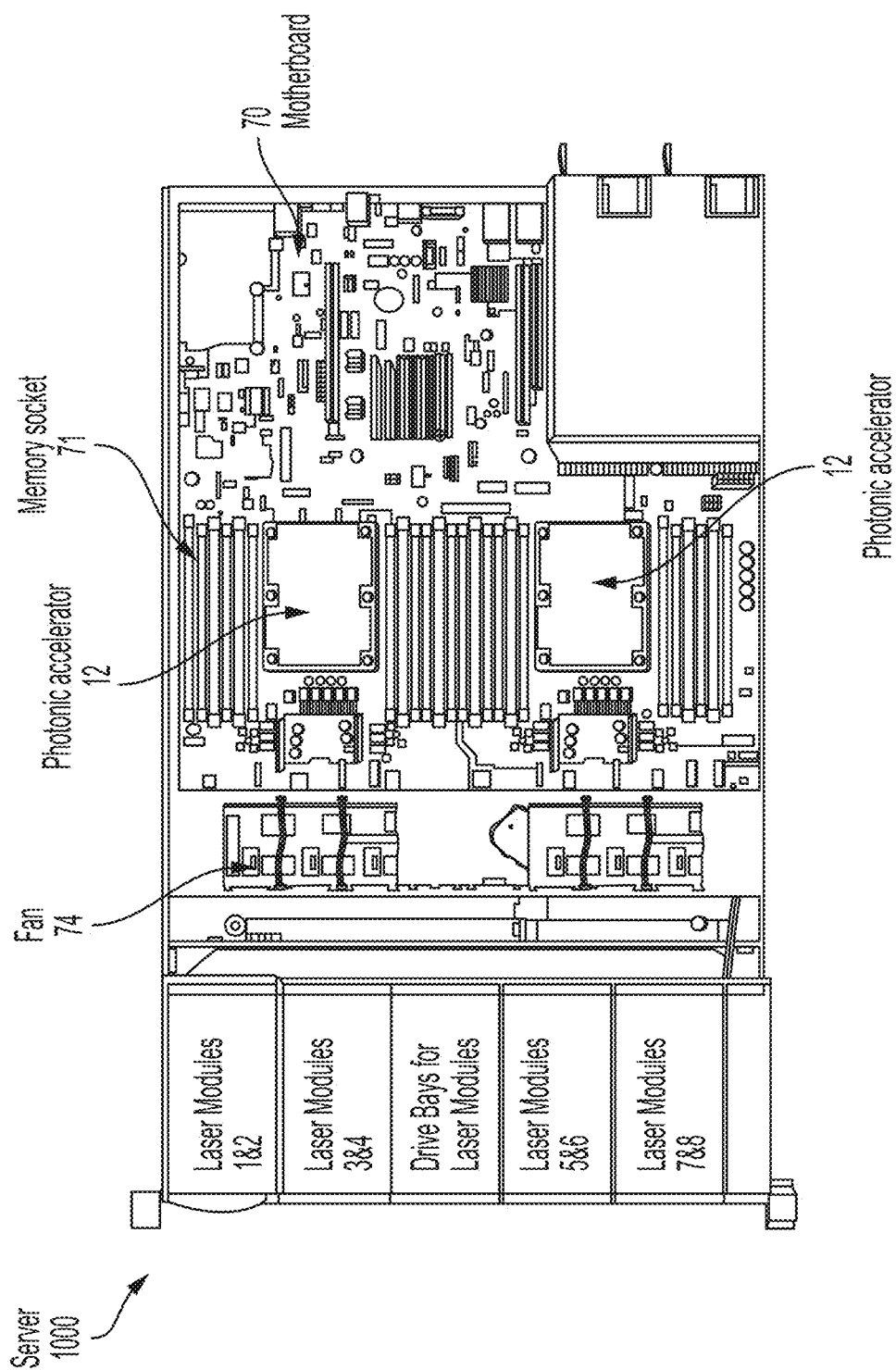
FIG. 10A is a top view of a server having multiple laser modules, in accordance with some embodiments.
Figure 10B:
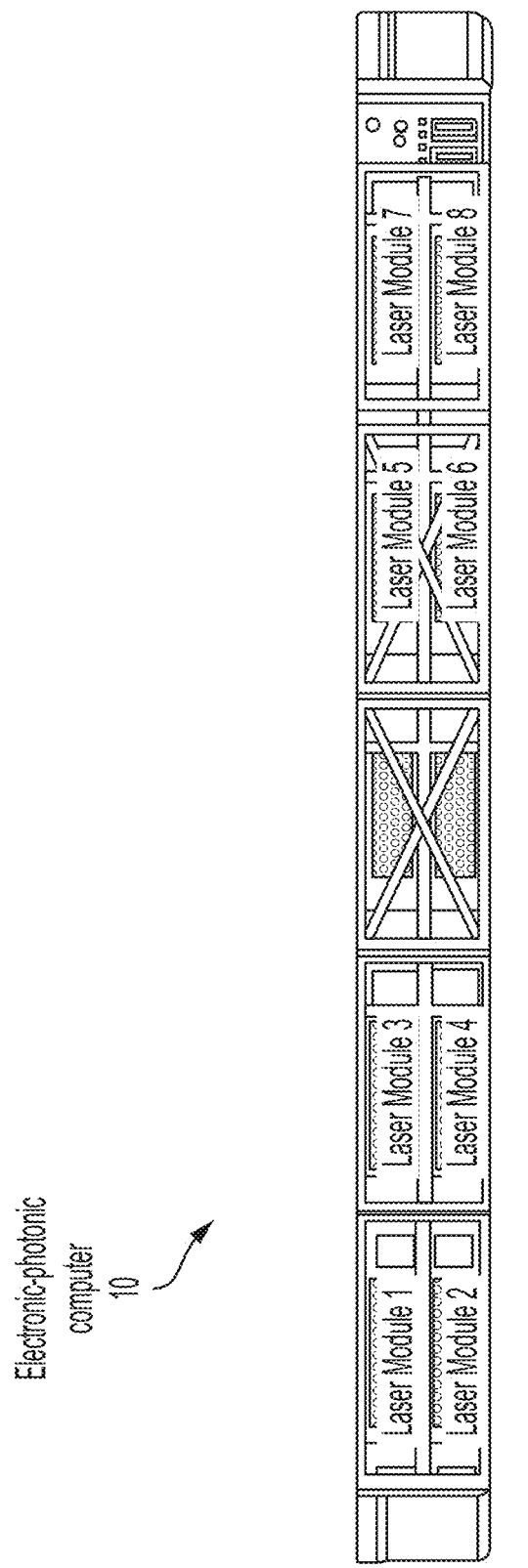
FIG. 10B is a front view of the server of FIG. 10A, in accordance with some embodiments.

One such server is depicted in FIGS. 10A-10B, in accordance with some embodiments. FIG. 10A is a top view and FIG. 10B is a front view of the server. The server may be implemented as a 1U server, a 2U server, a 3U server, etc., among other possible server formats. In this implementation, the server includes a motherboard 70, in which are mounted photonic accelerators 12, fans 74 and memory sockets 71, on which memory chips can be mounted. ASICs may be vertically stacked on top of the photonic accelerators (or vice versa). Embedded on the front side of the server are multiple laser modules (1, 2, 3, 4, 5, 6, 7, 8), examples of which are described in connection with FIGS. 9A-9B. The laser modules may be arranged as slidable units that can be inserted into the front side of a server rack. The laser modules include photonic sources of the types described herein and are coupled to photonic accelerators using fiber arrays (not shown in FIG. 10A-10B). As shown in FIG. 10B, the laser modules may be stacked on one another in pairs, although other arrangements are possible.

VI. Additional Comments

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

The definitions, as defined and used herein, should be understood to control over dictionary definitions, definitions in documents incorporated by reference and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some case and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately," "substantially," and "about" may be used to mean within ±10% of a target value in some embodiments. The terms "approximately," "substantially," and "about" may include the target value.

Use of ordinal terms such as "first," "second," "third," etc., in the claims to modify a claim element does not by itself connotate any priority, precedence, or order of one claim element over another or the temporal order in which acts of a method are performed, but are used merely as labels to distinguish one claim element having a certain name from another claim element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

What is claimed is:

1. A computer comprising:
    a photonic accelerator configured to perform matrix multiplication;
    a fiber array optically coupled to the photonic accelerator; and
    a photonic source optically coupled to the fiber array, the photonic source comprising:
        a laser array comprising a plurality of monolithically co-integrated lasers;
        a coupling lens array comprising a plurality of monolithically co-integrated lenses, the coupling lens array optically coupling the laser array to the fiber array; and
        a volume Bragg grating (VBG) optically coupled between the laser array and the coupling lens array, the VBG having a passband bandwidth of less than 1 nm.

2. The computer of claim 1, wherein the laser array is configured to emit between 0.1 W and 10 W of optical power.

3. The computer of claim 1, wherein the photonic source further comprises a collimating lens array comprising a plurality of monolithically co-integrated lenses, wherein the lenses of the collimating lens array are configured to collimate optical beams emitted by the laser array.

4. The computer of claim 3, wherein:
    at least some of the monolithically co-integrated lasers are vertically offset relative to one another thereby defining a vertical extension,
    the collimating lens array defines a mid-array axis with respect to a vertical direction, and
    the mid-array axis falls within the vertical extension with respect to the vertical direction.

5. The computer of claim 1, wherein the optical source further comprises a housing frame defining a first cavity, a second cavity and an enclosed window between the first cavity and the second cavity, wherein the laser array is disposed within the first cavity and the coupling lens array is disposed within the second cavity.

6. The computer of claim 5, wherein the housing frame further defines a step between the first cavity and the second cavity.

7. The computer of claim 5, wherein the housing frame is positioned so that optical beams emitted by the laser array pass through the window.

8. The computer of claim 1, wherein the optical source further comprises a water-cooled heat sink configured to cool the laser array.

9. A computer comprising:
    a photonic accelerator configured to perform matrix multiplication;
    a fiber array optically coupled to the photonic accelerator; and
    a photonic source optically coupled to the fiber array, the photonic source comprising:

a laser array comprising a plurality of monolithically co-integrated lasers;

a coupling lens array comprising a plurality of monolithically co-integrated lenses, the coupling lens array optically coupling the laser array to the fiber array; and an optical isolator optically coupled between the laser array and the coupling lens array, the optical isolator being configured to permit transmission of a plurality of optical beams emitted by the laser array.

10. The computer of claim 9, wherein the optical isolator comprises:
a first magnet embedded in a first magnet retainer;
a second magnet embedded in a second magnet retainer; and
a mount joining the first magnet retainer with the second magnet retainer.

11. The computer of claim 10, wherein the optical isolator further comprises an angled half-wave plate disposed between the first magnet and the second magnet.

12. The computer of claim 10, wherein the optical isolator further comprises a plate having a rare-earth iron garnet (RIG) film disposed between the first magnet and the second magnet.

13. A computer comprising:
a photonic accelerator configured to perform matrix multiplication;
a fiber array optically coupled to the photonic accelerator; and
a photonic source optically coupled to the fiber array, the photonic source comprising:
a laser array comprising a plurality of monolithically co-integrated lasers;
a coupling lens array comprising a plurality of monolithically co-integrated lenses, the coupling lens array optically coupling the laser array to the fiber array; and
a steering lens array comprising a plurality of monolithically co-integrated lenses, wherein the steering lens array is coupled between the laser array and the coupling lens array and is laterally offset relative to the coupling lens array.

14. The computer of claim 13, wherein the photonic source further comprises a collimating lens array comprising a plurality of monolithically co-integrated lenses, wherein the lenses of the collimating lens array are configured to collimate optical beams emitted by the laser array.

15. The computer of claim 14, wherein:
at least some of the monolithically co-integrated lasers are vertically offset relative to one another thereby defining a vertical extension,
the collimating lens array defines a mid-array axis with respect to a vertical direction, and
the mid-array axis falls within the vertical extension with respect to the vertical direction.

16. A method for manufacturing a computer, comprising:
obtaining a photonic accelerator configured to perform matrix multiplication;
obtaining a laser array comprising a plurality of monolithically co-integrated lasers;
obtaining a coupling lens array comprising a plurality of monolithically co-integrated lenses;
assembling a laser source using the laser array and the lens array, wherein assembling the laser source comprises optically aligning the lasers of the laser array with the lenses of the coupling lens array and optically coupling the laser array with a Volume Bragg Grating (VBG) having a passband bandwidth of less than 1 nm; and
optically coupling a first end of a fiber array to the photonic accelerator and optically coupling a second end of the fiber array to the coupling lens array.

17. The method of claim 16, wherein the laser array is configured to output between 0.1 W and 10 W of optical power.

18. The method of claim 16, wherein assembling the photonic source further comprises coupling the laser array to a collimating lens array comprising a plurality of monolithically co-integrated lenses, wherein the lenses of the collimating lens array are configured to collimate optical beams emitted by the laser array.

19. The method of claim 16, wherein assembling the optical source further comprises:
obtaining a housing frame defining a first cavity, a second cavity and an enclosed window between the first cavity and the second cavity, and
positioning the laser array within the first cavity and positioning the coupling lens array within the second cavity.

20. A method for manufacturing a computer, comprising:
obtaining a photonic accelerator configured to perform matrix multiplication;
obtaining a laser array comprising a plurality of monolithically co-integrated lasers;
obtaining a coupling lens array comprising a plurality of monolithically co-integrated lenses;
assembling a laser source using the laser array and the lens array, wherein assembling the laser source comprises optically aligning the lasers of the laser array with the lenses of the coupling lens array optically coupling the laser array to an optical isolator configured to permit transmission of a plurality of optical beams emitted by the laser array; and
optically coupling a first end of a fiber array to the photonic accelerator and optically coupling a second end of the fiber array to the coupling lens array.

21. The method of claim 20, wherein the optical isolator comprises:
a first magnet embedded in a first magnet retainer;
a second magnet embedded in a second magnet retainer; and
a mount joining the first magnet retainer with the second magnet retainer.

22. The method of claim 21, wherein the optical isolator further comprises an angled half-wave plate disposed between the first magnet and the second magnet.

23. The method of claim 21, wherein the optical isolator further comprises a plate having a rare-earth iron garnet (RIG) film disposed between the first magnet and the second magnet.

24. A method for manufacturing a computer, comprising:
obtaining a photonic accelerator configured to perform matrix multiplication;
obtaining a laser array comprising a plurality of monolithically co-integrated lasers;
obtaining a coupling lens array comprising a plurality of monolithically co-integrated lenses;
assembling a laser source using the laser array and the lens array, wherein assembling the laser source comprises optically aligning the lasers of the laser array with the lenses of the coupling lens array and coupling a steering lens array comprising a plurality of monolithically co-integrated lenses between the laser array and the coupling lens array, wherein coupling the steering lens array comprises laterally offsetting the steering lens array relative to the coupling lens array; and optically coupling a first end of a fiber array to the photonic accelerator and optically coupling a second end of the fiber array to the coupling lens array.

25. A method for manufacturing a computer, comprising:

obtaining a photonic accelerator configured to perform matrix multiplication;

obtaining a laser array comprising a plurality of monolithically co-integrated lasers;

obtaining a coupling lens array comprising a plurality of monolithically co-integrated lenses;

assembling a laser source using the laser array and the lens array, wherein assembling the laser source comprises optically aligning the lasers of the laser array with the lenses of the coupling lens array and coupling the laser array to a collimating lens array comprising a plurality of monolithically co-integrated lenses, wherein the lenses of the collimating lens array are configured to collimate optical beams emitted by the laser array; and optically coupling a first end of a fiber array to the photonic accelerator and optically coupling a second end of the fiber array to the coupling lens array, wherein at least some of the monolithically co-integrated lasers are vertically offset relative to one another thereby defining a vertical extension, and the collimating lens array defines a mid-array axis with respect to a vertical direction, and wherein coupling the laser array to the collimating lens array comprises positioning the mid-array axis within the vertical extension with respect to the vertical direction.

* * * * *